(12) United States Patent
Van Der Boom et al.

(10) Patent No.: US 8,917,539 B2
(45) Date of Patent: Dec. 23, 2014

(54) SOLID, MULTI-STATE MOLECULAR RANDOM ACCESS MEMORY

(75) Inventors: Milko E. Van Der Boom, Rishon Lezion (IL); Graham De Ruiter, Rishon Lezion (IL)

(73) Assignee: Yeda Research and Development Co., Ltd. (IL)

( * ) Notice: Subject to any disclaimer, the term of this patent is extended or adjusted under 35 U.S.C. 154(b) by 90 days.

(21) Appl. No.: 13/696,854

(22) PCT Filed: May 11, 2011

(86) PCT No.: PCT/IL2011/000375
§ 371 (c)(1), (2), (4) Date: Feb. 28, 2013

(87) PCT Pub. No.: WO2011/141913
PCT Pub. Date: Nov. 17, 2011

(65) Prior Publication Data
US 2013/0148413 A1    Jun. 13, 2013

Related U.S. Application Data

(60) Provisional application No. 61/333,558, filed on May 11, 2010.

(51) Int. Cl.
| | |
|---|---|
| *G11C 13/00* | (2006.01) |
| *G11C 13/04* | (2006.01) |
| *G11C 11/56* | (2006.01) |
| *G11C 11/54* | (2006.01) |
| *H01L 21/02* | (2006.01) |

(52) U.S. Cl.
CPC ............... *G11C 11/56* (2013.01); *G11C 11/54* (2013.01); *G11C 11/5664* (2013.01); *G11C 13/0014* (2013.01); *G11C 13/04* (2013.01); *G11C 13/041* (2013.01); *G11C 13/047* (2013.01); *H01L 21/02104* (2013.01)
USPC ............ 365/151; 365/153; 365/215; 438/381

(58) Field of Classification Search
CPC ......................... G11C 13/0014; G11C 11/5664
USPC ........................................................... 365/151
See application file for complete search history.

(56) References Cited

U.S. PATENT DOCUMENTS

| | | |
|---|---|---|
| 2004/0159835 A1 | 8/2004 | Krieger et al. |
| 2005/0207208 A1* | 9/2005 | Bocian et al. ................. 365/151 |

(Continued)

FOREIGN PATENT DOCUMENTS

WO    0152266 A1    7/2001

OTHER PUBLICATIONS

International Search Report; International Application No. PCT/IL2011/000375; International Application Filing Date May 11, 2011; Mail date Sep. 5, 2011.

Min J et al: "Electrochemical Biomemory Device Consisting of Recombinant Protein Molecules", Biotechnology and Bioprocess Engineering, vol. 15, No. 1, pp. 30-39 (2010).

(Continued)

*Primary Examiner* — Ly D Pham
(74) *Attorney, Agent, or Firm* — Cantor Colburn LLP

(57) ABSTRACT

A solid-state, multi-valued, molecular random access memory (RAM) device, comprising an electrically, optically and/or magnetically addressable unit, a memory reader, and a memory writer. The addressable unit comprises a conductive substrate; one or more layers of electrochromic, magnetic, redox-active, and/or photochromic materials deposited on the conductive substrate; and a conductive top layer deposited on top the one or more layers. The memory writer applies a plurality of predetermined values of potential biases or optical signals or magnetic fields to the unit, wherein each predetermined value applied results in a uniquely distinguishable optical, magnetic and/or electrical state of the unit, thus corresponding to a unique logical value. The memory reader reads the optical, magnetic and/or electrical state of the unit.

25 Claims, 16 Drawing Sheets

(56) References Cited

U.S. PATENT DOCUMENTS

| | | | |
|---|---|---|---|
| 2005/0232000 A1* | 10/2005 | Lindsey | 365/151 |
| 2006/0092687 A1* | 5/2006 | Kuhr et al. | 365/151 |
| 2006/0209587 A1* | 9/2006 | Bocian et al. | 365/151 |
| 2007/0258147 A1 | 11/2007 | Van Der Boom et al. | |
| 2008/0219041 A1* | 9/2008 | Kuhr et al. | 365/151 |
| 2010/0118598 A1* | 5/2010 | Hawkins et al. | 365/151 |

OTHER PUBLICATIONS

De Ruiter G et al: "Sequential Logic Operations with Surface-Confined Polypyridyl Complexes Displaying Molecular Random Access Memory Features", Angewandte Chemie International Edition, vol. 49, No. 1, pp. 169-172 (2010).

Written Opinion, International Application No. PCT/IL2011/000375; International Application Filing Date May 11, 2011; Mail date Sep. 5, 2011.

* cited by examiner

State 0: Cu(I)

−0.4 V ↑↓ +1.0 V

State 1: Cu(II)

M = Os, Ru;
X = I, PF$_6$

SOLID, MULTI-STATE MOLECULAR RANDOM ACCESS MEMORY

TECHNICAL FIELD

The present invention relates to molecular information processing in general and in particular to solid, multi-state, molecular random access memory (RAM) devices and methods.

BACKGROUND ART

Information technology is in the core of many industries today. More and more information is being stored and processed daily for personal or professional purposes. Devices made from semiconductor materials are the foundation of modern electronics, including computers, telephones, television, radio, and many other devices. Many other machines and tools from automobiles to airplanes to washing machines contain semiconductor parts that control the operation of the device or machine. Semiconductor devices include the various types of transistor, solar cells, many kinds of diodes including the light-emitting diode, the silicon controlled rectifier, and digital and analog integrated circuits. It is a continuous challenge for the information industry to develop information storage devices and processors that are smaller and faster.

Molecular information processing is becoming increasingly popular, because molecules are versatile synthetic building blocks for a bottom-up approach to information transfer and storage. In particular, the field of molecular logic has attracted much attention. The logic behavior of molecules upon specific inputs has found potential applications in sensors, medical diagnostics, molecular memory devices and molecular computational identification (MCID) tags. Thus far, the applied logic is almost exclusively based on the underlying principle of mathematical operations performed on a system that can exist exclusively in two stable states, as introduced by George Boole. Their ease of fabrication and their wide variety of applications have made binary systems the status quo for (molecular) information processing technology.

SUMMARY OF INVENTION

It is an object of the present invention to provide a multi-valued random access memory device.

It is another object of the present invention to provide a random access memory device capable of storing 3, 4 or 5 states.

It is a further object of the present invention to provide a solid-state, multi-valued random access memory device.

It is yet another object of the present invention to provide a solid-state, multi-valued random access memory device that is electrically addressable.

It is yet another object of the present invention to provide a solid-state, multi-valued random access memory device that is readable optically, electronically or electrochemically.

The present invention relates to a solid-state, multi-valued, molecular random access memory (RAM) device, comprising:

(i) an electrically, optically and/or magnetically addressable unit, comprising: (a). a conductive substrate; (b). one or more layers of electro-chromic, magnetic, redox-active, and/or photochromic materials deposited on said conductive substrate; (c). a conductive top layer deposited on top of said one or more layers of (b);

(ii) a memory writer that applies a plurality of predetermined values of potential biases or optical signals or magnetic fields to the unit, wherein each predetermined value applied results in a uniquely distinguishable optical, magnetic and/or electrical state of said unit, and thus corresponds to a unique logical value; and (iii) a memory reader for reading the optical, magnetic and/or electrical state of the unit.

In some embodiments of the present invention, the conductive substrate is hydrophilic, hydrophobic or a combination thereof.

In some embodiments of the present invention, the conductive substrate is transparent.

In some embodiments of the present invention, the molecular RAM device is reconfigurable to work as a binary, ternary, quartenary or any other multi-state memory device.

In some embodiments of the present invention, the conductive substrate includes a material selected from glass, a doped glass, indium tin oxide (ITO)-coated glass, silicon, a doped silicon, Si(100), Si(111), $SiO_2$, SiH, silicon carbide mirror, quartz, a metal, metal oxide, a mixture of metal and metal oxide, group IV elements, mica, a polymer such as polyacrylamide and polystyrene, a plastic, a zeolite, a clay, a membrane, an optical fiber, a ceramic, a metalized ceramic, an alumina, an electrically-conductive material, a semiconductor, steel or a stainless steel.

In some embodiments of the present invention, the conductive substrate is in the form of beads, microparticles, nanoparticles, quantum dots or nanotubes.

In some embodiments of the present invention, the conductive substrate is optically transparent to the ultraviolet (UV), infrared (IR), near-IR (NIR) and/or visible spectral ranges.

In some embodiments of the present invention, the one or more layers of electrochromic, magnetic, redox-active or photochromic materials comprise a plurality of identical or different layers of said electrochromic, magnetic, redox-active or photochromic materials.

In some embodiments of the present invention, the electrochromic materials comprise organic, metal-organic, inorganic or polymeric materials, or any combination thereof.

In some embodiments of the present invention, the organic or metal-organic electrochromic material is selected from (i) viologen (4,4'-bipyridylium salts) or its derivatives; (ii) azol compounds; (iii) aromatic amines; (iv) carbazoles; (v) cyanines; (vi) methoxybiphenyls; (vii) quinones; (viii) thiazines; (ix) pyrazolines; (x) tetracyanoquinodimethanes (TCNQs); (xi) tetrathiafulvalene (TTF); (xii) a metal coordination complex wherein said complex is $[MII(2,2'-bipyridine)_3]^{2+}$ or $[MII(2,2'-bipyridine)_2(4-methyl-2,2'-bipyridine-pyridine]^{2+}$, wherein M is iron, ruthenium, osmium, nickel, chromium, copper, rhodium, iridium or cobalt, or a polypyridyl metal complex selected from tris(4-[2-(4-pyridyl)ethenyl]-4'-methyl-2,2'-bipyridine Osmium(II) bis(hexafluorophosphate), tris(4-[2-(4-pyridyl)ethenyl]-4'-methyl-2,2'-bipyridine Cobalt(II) bis(hexafluorophosphate), tris(4-[2-(4-pyridyl) ethenyl]-4'-methyl-2,2'-bipyridine)Ruthenium(II)bis(hexafluorophosphate), bis(2,2'-bipyridine) [4'-methyl-4-(2-(4-pyridyl)ethenyl)-2,2'-bipyridine] Osmium(II) [bis(hexafluorophosphate)/di-iodide], bis(2,2'-bipyridine)[4'-methyl-4-(2-(4-pyridyl)ethenyl)-2,2'-bipyridine] Ruthenium (II) [bis(hexafluorophosphate)/di-iodide], bis(2,2'-bipyridine)[4'-methyl-4-(2-(4-(3-propyl trimethoxysilane) pyridinium)ethenyl)-2,2'-bipyridine] Osmium(II) [tris(hexafluorophosphate)/tri-iodide], or bis(2,2'-bipyridine)[4'-methyl-4-(2-(4-(3-propyl trimethoxysilane) pyridinium) ethenyl)-2,2'-bipyridine] Ruthenium(II) [tris(hexafluorophosphate)/tri-iodide]; (xiii) metallophthalocyanines or porphyrins in mono, sandwich or polymeric forms; (xiv) metal hexacyanometallates; (xv) dithiolene complexes of nickel, palladium or platinum; (xvi) dioxylene complexes of osmium or ruthenium; or (xvii) derivatives thereof.

In some embodiments of the present invention, the viologen is methyl viologen (MV).

In some embodiments of the present invention, the azol compound is 4,4'-(1E,1'E)-4,4'-sulfonylbis(4,1-phenylene) bis(diazene-2,1-diyl)bis(N,N-dimethyl aniline).

In some embodiments of the present invention, the inorganic electrochromic materials comprise tungsten oxide, iridium oxide, vanadium oxide, nickel oxide, molybdenum oxide, titanium oxide, manganese oxide, niobium oxide, copper oxide, tantalum oxide, rhenium oxide, rhodium oxide, ruthenium oxide, iron oxide, chromium oxide, cobalt oxide, cerium oxide, bismuth oxide, tin oxide, praseodymium, lanthanide hydrides ($LaH_2/LaH_3$), nickel doped $SrTiO_3$, indium nitride, ruthenium dithiolene, phosphotungstic acid, ferrocene-naphthalimides dyads, organic ruthenium complexes, or any mixture thereof.

In some embodiments of the present invention, the polymeric electrochromic materials comprise conducting polymers such as polypyrroles, polydioxypyrroles, polythiophenes, polyanilines, poly(acetylene)s, poly(p-phenylene sulfide), poly(p-phenylene vinylene)s (PPV), polyindoles, polypyrenes, polycarbazoles, polyazulenes, polyazepines, poly(fluorene)s, polynaphthalenes, polyfurans, metallopolymeric films based on polypyridyl complexes or polymeric viologen systems comprising pyrrole-substituted viologen, pyrrole disubstituted viologen, N,N'-bis (3-pyrrol-1-ylpropyl)-4,4'-bipyridilium or derivatives of said conducting polymers.

In some embodiments of the present invention, the photochromic materials comprise triarylmethanes, stilbenes, azastilbenes, nitrones, fulgides, spiropyrans, naphthopyrans, spiro-oxazines or quinones.

In some embodiments of the present invention, the conductive top layer comprises a thin metal film or a conductive polymer such as Nafion.

In some embodiments of the present invention, the memory reader reads the optical state of said unit optically, electrochemically, magnetically, electronically, reading changes in conductivity, refractive index readout, IR readout or NIR readout.

In some embodiments of the present invention, the memory reader is an optical device.

In some embodiments of the present invention, the molecular RAM device maintains its current state when no voltage is applied.

In some embodiments of the present invention, a plurality of units are coupled together and said memory reader can read the optical, magnetic and/or electronic state of said coupled units simultaneously.

In some embodiments of the present invention, the molecular RAM device comprises flip-flop, flip-flap-flop or any combination of logic circuits.

In some embodiments of the present invention, the conductive substrate is a metal-oxide or conductive polymer, said material comprises of polypyridyl complexes, and said conductive top layer is a metal-oxide or conductive polymer, such that said molecular RAM device is a flip-flop logic circuit set to state 1 by applying a voltage to oxidize said material and reset to state 0 by applying a voltage to reduce said material.

In some embodiments of the present invention, the conductive substrate is a metal-oxide or conductive polymer, said material comprises of polypyridyl complexes, and said conductive top layer is a metal-oxide or conductive polymer, such that said molecular RAM device is a flip-flap-flop logic circuit set to state −1 by applying a voltage to oxidize said material, set to state 1 by applying a voltage to partial oxidize or reduce said material and reset to state 0 by applying a voltage to reduce said material.

In some embodiments of the present invention, the conductive substrate is a metal-oxide or conductive polymer, said materials comprises of polypyridyl complexes, and said conductive top layer is a metal-oxide or conductive polymer, such that said molecular RAM device comprises 4-10 states logic circuits, said 4-10 states being obtained by applying predetermined voltages between −2 and 3 Volt.

In some embodiments of the present invention, the molecular RAM device does not maintain its current state when no voltage is applied.

In some embodiments of the present invention, the molecular RAM device comprises logic circuits.

In another aspect the present invention relates to a method for constructing a solid-state, multi-valued, molecular random access memory device, comprising the steps of:

(i) constructing an electrically, optically and/or magnetically addressable unit by depositing one or more layers of electrochromic, magnetic, redox-active or photochromic materials deposited on a conductive substrate and then depositing a conductive top layer on top of said one or more layers;

(ii) applying a plurality of predetermined potential biases to the unit, wherein each predetermined voltage value applied results in a distinguishable optical, electronic and/or magnetic state of said unit, and thus corresponds to a unique logical value; and (iii) reading the optical, electronic and/or magnetic of said unit.

BRIEF DESCRIPTION OF THE DRAWINGS

FIG. 4B shows the derivative of the sigmoidal fit and the corresponding full-width at half-maximum (FWHM).

FIG. 5A shows absorbance of the MLCT band at λ=510 nm of the 3-based assembly (17 deposition steps), as a function of time upon applying double-potential steps between 0.60 and 1.30 V with 3-s intervals. The dotted lines indicate the threshold values for a logical 1 and 0, respectively and the applied potential values. FIG. 5B shows the behaviour of the flip-flop device of FIG. 5A in terms of sequential logic circuits.

FIG. 7A shows absorbance of the MLCT band at λ=510 nm of the 3-based assembly (17 deposition steps), as a function of time upon applying triple-potential steps whose ranges include 0.60, 0.91 and 1.30 V with 3-s intervals. The dotted lines indicate three attainable different states and the applied potential values. FIG. B shows a flip-flap-flip logic circuit generated with the 3-based assembly with 1.30 V ($I_1$), 0.91 V ($I_2$) and 0.60 V ($I_3$) as inputs. The outputs −1, 0 and 1 correspond to the different absorption values of the MLCT band at λ=510 nm.

FIG. 8A shows four-state memory generated by applying quadruple-potential steps between 0.60, 0.89, 0.95 and 1.30 V with subsequent monitoring of the intense absorption band λ=510 nm. FIG. 8B shows five-state memory generated by applying quintuple-potential steps whose ranges include 0.60, 0.87, 0.92, 0.99 and 1.30 V with subsequent monitoring of the intense absorption band λ=510 nm.

FIG. 9B shows magnification (70×) of the FIG. 9A, displaying the first minute of the auto-reset.

FIG. 11A shows modulation from −0.60--0.10 V; −0.10-0.1 V and 0.10-0.60 V. FIG. 11B shows modulation from −0.60--0.15 V; −0.15-0.00 V; 0.00-0.15 V and 0.15-0.60V. FIG. 11C shows modulation from −0.60--0.20 V; −0.20--0.10 V; −0.10-0.00 V; 0.00-0.10 V and 0.10-0.60 V. In addition, after each set of double-potential steps, the electrochemical potential was cycled from −0.60-0.60 V to show complete reversibility.

FIG. 12A shows double-potential steps between −0.60 and 0.60 V in a chronoamperometric experiment. FIG. 12B shows triple-potential steps between −0.60, 0.00 and 0.60 V in a chrono-amperometric experiment.

FIG. 13B shows magnification (70×) of the FIG. 13A, displaying the first minute of the auto-reset.

FIG. 18A shows quadruple potential steps with 3-s intervals. FIGS. 18B shows quintuple potential steps with 3-s intervals. The dotted lines indicate the attainable memory states and the applied potential values.

FIG. 19A shows quaternary memory and FIG. 19B shows quinary memory.

MODES FOR CARRYING OUT THE INVENTION

Figure 1:
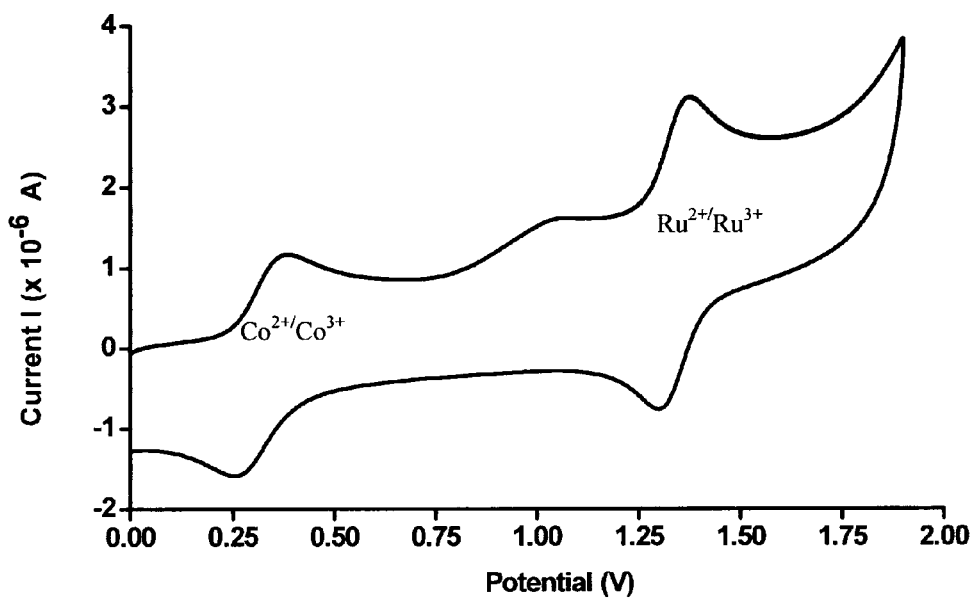
FIG. 1 shows a cyclic voltammetry (CV) of [Co(mbpy-py)$_3$](PF$_6$)$_2$ herein identified as complex 1 (0.1 mM), and of Ru(bpy)$_2$(mbpy-py)l(PF$_6$)$_2$ (0.1 mM), in acetonitrile with NBu$_4$BF$_4$ (0.1 M) as supporting electrolyte and Ag/AgCl, platinum, and glassy carbon as reference, counter and working electrode, respectively.

In the following detailed description of various embodiments, reference is made to the accompanying drawings that form a part thereof, and in which are shown by way of illustration specific embodiments in which the invention may be practiced. It is understood that other embodiments may be utilized and structural changes may be made without departing from the scope of the present invention.

In one aspect, the present invention relates to a solid-state, multi-valued, molecular random access memory (RAM) device. The molecular device comprises 3 main parts. First, an electrically, optically and/or magnetically addressable unit, comprising: a conductive substrate; one or more layers of electrochromic, redox-active, or photochromic materials deposited on the conductive substrate; and a conductive top layer deposited on the top layer of the electrochromic, magnetic, redox-active, or photochromic materials. Second, in order to set or reset the memory device, a memory writer is coupled to the memory device. The memory writer can apply a plurality of predetermined potential biases, light pulses, or magnetic fields to the unit. Each predetermined input applied results in a uniquely distinguishable optical, magnetic and/or electrical state of the unit, and thus corresponds to a unique logical value. The third component of the molecular RAM device is a memory reader that reads the optical, magnetic and/or electrical state of the unit.

Magnetic changes can be read (and are read in commercial available systems) by magnetic induction, the local magnetic fields induce a current which is detected. The absence of a magnetic field produces no current (logical value of 0), whereas the presence of a magnetic field produces a current (logical value of 1).

In some embodiments, the substrate is hydrophilic, hydrophobic or a combination thereof.

In some embodiments, the substrate includes a material selected from glass, a doped glass, indium tin oxide (ITO)-coated glass, silicon, a doped silicon, Si(100), Si(111), SiO$_2$, SiH, silicon carbide mirror, quartz, a metal, metal oxide, a mixture of metal and metal oxide, group IV elements, mica, a graphite comprising intercalated metal cations, a polymer such as polyacrylamide and polystyrene, a plastic, a zeolite, a clay, a membrane, an optical fiber, a ceramic, a metalized ceramic, an alumina, an electrically-conductive material, a semiconductor, steel or a stainless steel. In some embodiments, the substrate as defined hereinabove is in the form of beads, microparticles, nanoparticles, quantum dots or nanotubes.

The electrochromic materials can comprise organic, inorganic, polymeric materials or any combination thereof.

In some embodiments, the polymeric electrochromic materials comprise conducting polymers such as polypyrroles, polydioxypyrroles, polythiophenes, polyanilines, poly(acetylene)s, poly(p-phenylene sulfide), poly(p-phenylene vinylene)s (PPV), polyindoles, polypyrenes, polycarbazoles, polyazulenes, polyazepines, poly(fluorene)s, polynaphthalenes, polyfurans, metallopolymeric films based on polypyridyl complexes or polymeric viologen systems comprising pyrrole-substituted viologen pyrrole disubstituted viologen, N,N'-bis(3-pyrrol-1-ylpropyl)-4,4'-bipyridilium or derivatives of said conducting polymers. Non limiting examples are polypyrrole, polyaniline, poly(3,4-ethylenedioxythiophene) (PEDOT), poly(3,4-propylenedioxy)thiophene PProDOT, poly(2,4-ethylenedioxythiophenedidodecyloxybenzene), poly(3,4-ethylenedioxythiophene)-poly(styrene sulfonate) (PEDOT-PSS), poly(3,4-(ethylenedioxy)pyrrole (PEDOP), poly(3,4-(propylenedioxy)pyrrole (PProDOP), poly(3,4-(butylenedioxy)pyrrole (PBuDOP), poly(o-toluidine, poly(m-toluidine) or poly(o-methoxyaniline).

In some embodiments, the electrochromic materials comprise organic or metal-organic material selected from (i) viologen (4, 4'-bipyridylium salts) or its derivatives; (ii) azol compounds; tetracyanoquinodimethanes (TCNQs); (iii) aromatic amines; (iv) carbazoles; (v) cyanines; (vi) methoxybiphenyls; (vii) quinones; (viii) thiazines; (ix) pyrazolines; (x) tetracyanoquinodimethanes (TCNQs); (xi) tetrathiafulvalene (TTF); (xii) metal coordination complex wherein said complex is [M$^{II}$(2,2'-bipyridine)$_3$]$^{2+}$ or [M$^{II}$(2,2'-bipyridine)$_2$(4-methyl-2,2'-bipyridine-pyridine)]$^{2+}$, wherein said M is iron, ruthenium, osmium, nickel, chromium, copper, rhodium, iridium or cobalt, or a polypyridyl metal complex selected from tris(4-[2-(4-pyridypethenyl]-4'-methyl-2,2'-bipyridine Osmium(II) bis(hexafluorophosphate), tris(4-[2-(4-pyridypethenyl]-4'-methyl-2,2'-bipyridine Cobalt(II) bis(hexafluorophosphate), tris(4-[2-(4-pyridyl)ethenyl]-4'-methyl-2,2'-bipyridine)Ruthenium(II)bis(hexafluorophosphate), bis(2,2'-bipyridine)[4'-methyl-4-(2-(4-pyridyl)ethenyl)-2,2'-bipyridine] Osmium(II) [bis(hexafluorophosphate)/di-iodide], bis(2,2'-bipyridine)[4'-methyl-4-(2-(4-pyridyl)ethenyl)-2,2'-bipyridine] Ruthenium(II) [bis (hexafluorophosphate)/di-iodide], bis(2,2'-bipyridine)[4'-methyl-4-(2-(4-(3-propyl trimethoxysi lane) pyridinium) ethenyl)-2,2'-bipyridine] Osmium(II) [tris (hexafluorophosphate)/tri-iodide], or bis(2,2'-bipyridine)[4'-methyl-4-(2-(4-(3-propyl trimethoxysilane) pyridinium) ethenyl)-2,2'-bipyridine] Ruthenium(II) [tris(hexafluorophosphate)/tri-iodide]; (xiii) metallo-phthalocyanines or porphyrins in mono, sandwich or polymeric forms; (xiv) metal hexacyanometallates; (xv) dithiolene complexes of nickel, palladium or platinum; (xvi) dioxylene complexes of osmium or ruthenium; (xvii) mixed-valence complexes of ruthenium, osmium or iron; or (xviii) derivatives thereof.

Non limiting examples are indigo blue, toluylene red, safranin O, azure A, azure B, methylene blue, basic blue 3, nile blue, resazurin, resorufin, viologen, methyl viologen MV, tetramethylphenylenediamine (TMPD), 1,4-naphthaquinone, 9,10-anthraquinone, 4,4'-(1E,1'E)-4,4'-sulfonyl-bis(4,1-phenylene)bis(diazene-2,1-diyl)bis(N,N-dimethylaniline), Prussian blue Fe$_4$[Fe(CN)$_6$]$_3$, ruthenium purple, vanadium hexacyanoferrate, nickel hexacyanoferrate, copper hexacyanoferrate, palladium hexacyanoferrate, indium hexacyanoferrate, gallium hexacyanoferrate, cadmium hexacyanoferrate, chromium hexacyanoferrate, cobalt hexacyanoferrate, manganese hexacyanoferrate, molybdenum hexacyanoferrate, osmium hexacyanoferrate, platinum hexacyanoferrate, rhenium hexacyanoferrate, rhodium hexacyanoferrate, silver hexacyanoferrate, ruthenium hexacyanoferrate, titatium hexacyanoferrate, zinc hexacyanoferrate, zirconium hexacyanoferrate, osmium hexacyanoruthenate, lanthanum hexacyanoferrate, samarium hexacyanoferrate, uranium hexacyanoferrate, metal phthalocyanines or porphyrins in mono, sandwich or polymeric forms, where the metal is luthetium, americium, europium, thorium, gallium, aluminium, copper, chromium, erbium, iron, magnesium, manganese, titanium, uranium, vanadium, ytterbium, zinc, zirconium tin, molybdenum, or mixture of phthalocyanines with the lanthanide metals and/or the above describe systems.

In some embodiments, the electrochromic materials comprise inorganic electrochromic materials such as tungsten oxide, iridium oxide, vanadium oxide, nickel oxide, molybdenum oxide, titanium oxide, manganese oxide, niobium oxide, copper oxide, tantalum oxide, rhenium oxide, rhodium oxide, ruthenium oxide, iron oxide, chromium oxide, cobalt oxide, cerium oxide, bismuth oxide, tin oxide, praseodymium, bismuth, lead, silver, lanthanide hydrides (LaH$_2$/LaH$_3$), nickel doped SrTiO$_3$, indium nitride, ruthenium dithiolene, phosphotungstic acid, ferrocene-naphthalimides dyads, organic ruthenium complexes or any mixture thereof. For example, mixtures of metal oxides include but are not limited to mixtures of tantalum/zirconium oxide or iridium/ruthenium oxides. In addition, metal oxyfluorides, or electrochromic oxides incorporating precious metals (including, Ag, Au, and Pt) may also be used.

In some embodiments, the photochromic materials comprise diarylethenes, triarylmethanes, stilbenes, azastilbenes, nitrones, fulgides, spiropyrans, spiroimidines, naphthopyrans, spiro-oxazines or quinones. Non limiting examples are azobenzene; cis1,2-dicyano-1,2-bis(2,4,5-trimethyl-3-thienyl)ethane; thioindigo; 1,2-bis[2-methylbenzo[b]thiophen-3-yl]-3,3,4,4,5,5-hexafluoro-1-cyclopentene; 1,2-bis[2,4-dimethyl-5-phenyl-3-thien-yl]-3,3,4,4,5,5-hexafluoro-1-cyclopentene; 1,2-bis[2-methyl-5-(pyridin-4-yl)-3-thien-yl]-3,3,4,4,5,5 -hexafluoro-1-cyclopentene; 2,3-bis(2,4,5-trimethyl-3thienyl)maleic anhydride; 2,3-bis(2,4,5-trimethyl-3thienyl)maleimide; 1-(2-hydroxyethyl)-3,3,-dimethylindolino-6'-nitrobenzo-pyrylospiran; 1,3,3,-trimethylindolinobenzopyrylospiran; 1,3,3,-trimethylindolino-6'-bromobenzopyrylospiran; 1,3,3 ,-trimethylindolino-8'-methoxybenzopyrylo-spiran; 1,3,3 ,-trimethylindolino-β-naphtopyrylospiran; 1,3,3,-trimethylindolino-naphtospirooxazine; 1,3,3 ,-trimethylindolino-6'-nitrobenzopyrylospiran; 2,3-dihydro-2-spyro-4'-[8'-aminonaphthalen-1' (4H')-one]permidine(=PNO-p); 2,3-dihydro-2-spyro-7'-[8'-imino-7',8'-dihydronaphthalen-1'amine]permidine(=PNI); 4,4'-bipyridyl; 1,1'-bis(2,4-dinitrophenyl)-4,4'-bipyridinium dichloride; 1,1'-dibenzyl-4,4'-bipyridinium dichloride; 1,1'-di-n-heptyl-4,4'-bipyridinium dibromide; 1,1'-di-n-octyl-4,4'-bipyridinium dibromide; 1,1'-diphenyl-4,4'-bipyridinium dichloride; 1,1'-dimetyl-4,4'-bipyridinium dichloride hydrate; 1,1'-dimetyl-4,4'-bipyridinium dichloride; 3,3 -diphenyl-3=H-naphtho [2,1 -b]pyran; or 2,5-norbornadiene (stabilized with BHT).

Figure 15:
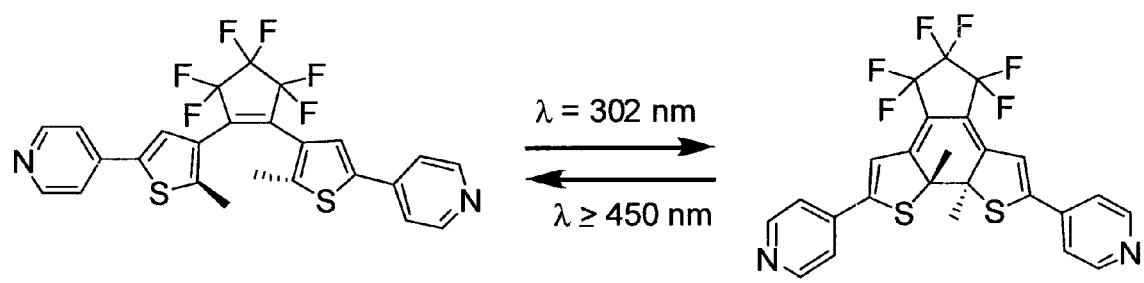
FIG. 15 shows light-induced photoisomerization of dithienylethene (DTE) 1,2-bis[2-methyl-5-(pyridin-4-yl)-3-thienyl]-3,3,4,4,5,5-hexafluoro-1-cyclopentene used for the construction of an optical molecular Set/Reset (SR) flip-flop.

For example, set/reset flip-flops were mimicked in solution and in the solid-state with dithienylethene (DTE; FIG. 15). Irradiation of the open form of this photochromic compound at λ=302 nm for 40 seconds leads to isomerization to the closed form: Q=0→1. The different absorption properties of the isomers allow one to discriminate between the two states. In contrast, irradiation at λ=450 nm for 10 minutes has the opposite effect: Q=1→0. Evidently, if one does not irradiate the molecule, it stays in its current state, since both the open and closed forms are stable for months.

In some embodiments, the substrate is optically transparent to the Ultra-Violet (UV), Near Infra-Red (NIR)/Infra-Red (IR) and visible spectral ranges. If the optical state of the molecular memory device is read optically, it is essential for the conductive substrate to be transparent. However, if the optical state of the molecular memory device is read by non-optical methods such as electrochemically, magnetically or electronically, it is not necessary for the conductive substrate to be transparent, not in the UV nor in the visible spectral ranges.

A very important feature of the molecular memory device is its ability to be reconfigured to serve as a plurality of memory devices each capable of storing a different amount of values. For example, most memory devices available today in the commercial market are binary devices (based on flip-flop logical circuits) thus each cell (bit) being capable of two different states (commonly noted as "0" and "1"). The molecular, memory device of the invention can be configured to serve as a binary device, or a ternary device (storing 3 different states), a quaternary device (storing 4 different states), a device storing 5 different states, and even up to 10 or more states.

In some embodiments, a solid-state, multi-valued Random Access Memory device is capable of storing three independent states. The three different states may be generated, for example, by polypyridyl complexes of Cobalt such as (Co (mbpy-py)$_3$(PF$_6$)$_2$ 1) and polypyridyl complexes of Ruthenium such as (Ru(mbpy-py)$_3$(PF$_6$)$_2$, or Osmium such as (Os(mbpy-py)$_3$(PF$_6$)$_2$) respectively. The different oxidation potentials of these compounds; $E_{1/2}$≈0.30 V (Co) vs. $E_{1/2}$≈1.30 (Ru), allow one to individually address the oxidation states of these compounds, in solution or in a solid state setup, by applying an appropriate potential bias as shown in FIG. 1. This generates three distinct states, namely: $Co^{2+}$/$Ru^{2+}$, $Co^{3+}$/$Ru^{2+}$ and $Co^{3+}$/$Ru^{3+}$ respectively.

Figures 3, 4A:
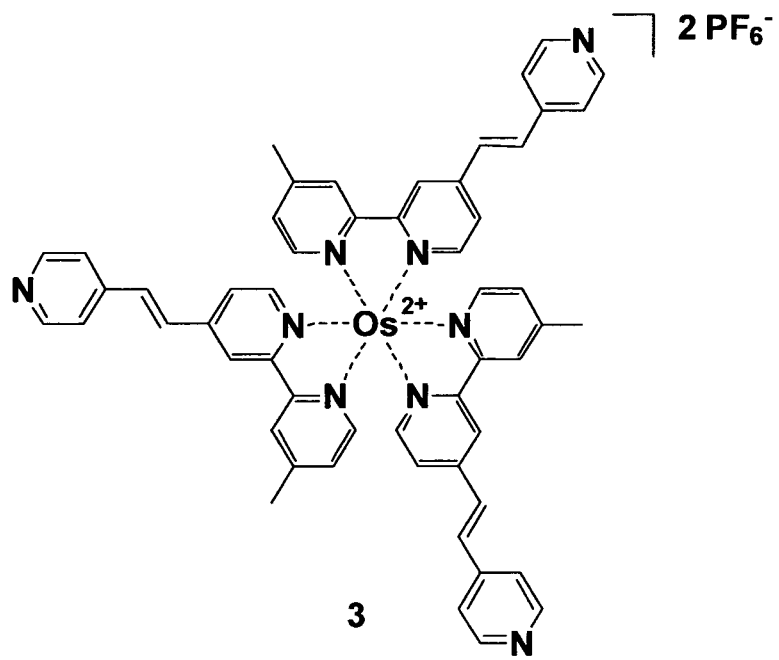
FIG. 3 shows representative molecular structure of the osmium polypyridyl complex 3 used. Step-wise deposition of complex 3 and PdCl$_2$ on Indium Tin Oxide (ITO)-coated glass functionalized with a pyridyl-group terminated monolayer resulted in the 3-based assembly.
FIGS. 4A-4B show difference in absorbance (ΔA) of the MLCT band at λ=510 nm of the 3-based assembly (19 deposition steps), as a function of the voltage, upon applying double-potential steps, with 1-s intervals, between 0.60 V and (0.60 V+n0.05 V), with n=1-14. Each dot represents the average of 10 double-potential cycles. The dashed red line is a sigmoidal fit ($R^2$=0.999) of the data, with an inflection point at 0.91 V, which corresponds to the $E_{ox}$ of an assembly after 19 deposition steps.

Initial steps towards achieving multi-state memory were taken with a self-propagating molecular-based assembly (SPMA). The SPMA consists of an osmium polypyridyl complex 3 covalently grafted on ITO. Alternate immersion in a solution of Pd(PhCN)$_2$Cl$_2$ and the osmium complex 3 results in an exponential growing network. The molecular memory was constructed by using the optical absorbance of the SPMA at λ=510 nm. When fully oxidized ($Os^{3+}$) the MLCT band is bleached and the system is in state 0. When the assembly is fully reduced ($Os^{2+}$), the absorbance is restored and the system is in state 1. Modulation of the oxidation state can be achieved electrochemically by applying a potential within the range of 0.60-1.30 V. The presence or absence of an applied potential is therefore defined as a logical 1 or 0, respectively. Although modulation of the oxidation state is binary in nature, the absorbance is a precise function of the applied voltage and can be used to create multiple states (FIG. 4A). However, the multiple-states are generated by the assembly as a whole, rather than by an individual molecule, which is binary.

Figure 4B:
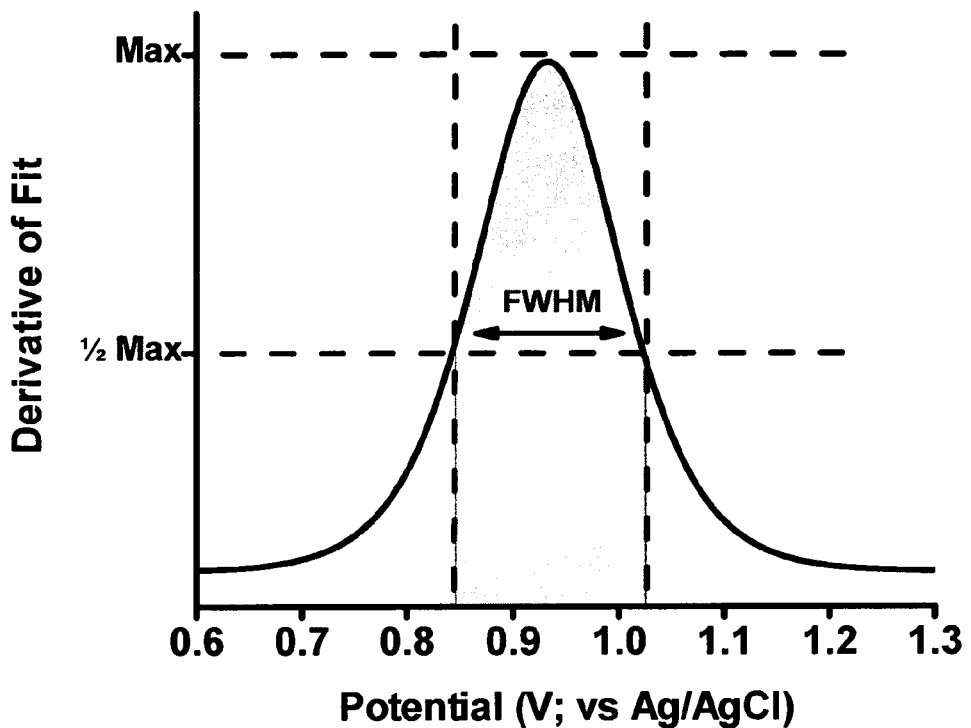

The observed dependence of the absorbance upon changing the potential is represented by a sigmoidal shape. Differentiating the obtained function results in a normal distribution centered on the E½ of the electro-active material, which is expected (FIG. 4B). Within this, the Full-Width at Half-Maximum (FWHM) of the response-potential characteristics is a useful benchmark. The FWHM describes the potential range in which the intended material is functional. If the range is too narrow, a small change in the potential leads to a large optical change. This is undesirable, since it introduces errors making it difficult to differentiate between states. In contrast, a large FWHM makes each state easy to distinguish, although the potential range might be too large for practical applications. The SPMA has a relatively small FWHM of 0.17 V. In combination with the short retention times of the assembly, we were able to generate dynamic random access memory (DRAM) that was able to reach four and five states. This type of memory needs a periodical potential pulse, typically in the millisecond regime, in order to maintain the current state. The memory properties might be improved by increasing the FWHM and the stability of the SPMA.

Figure 5A:
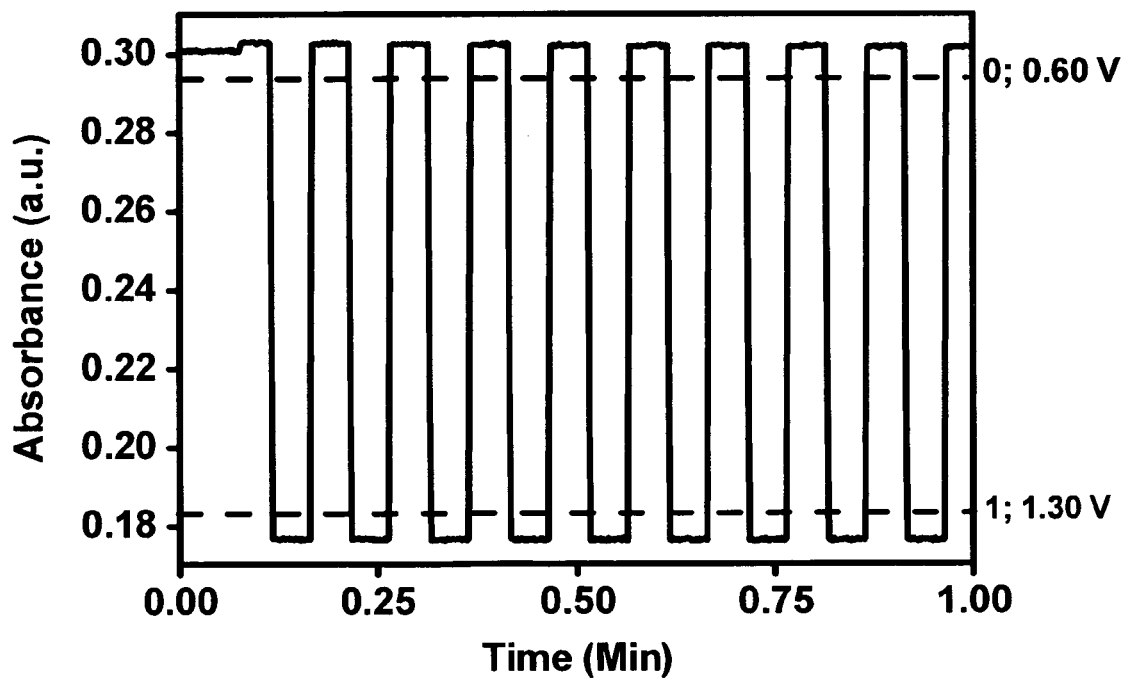
FIGS. 5A-5B show an electrically addressable flip-flop device.
Figure 5B:
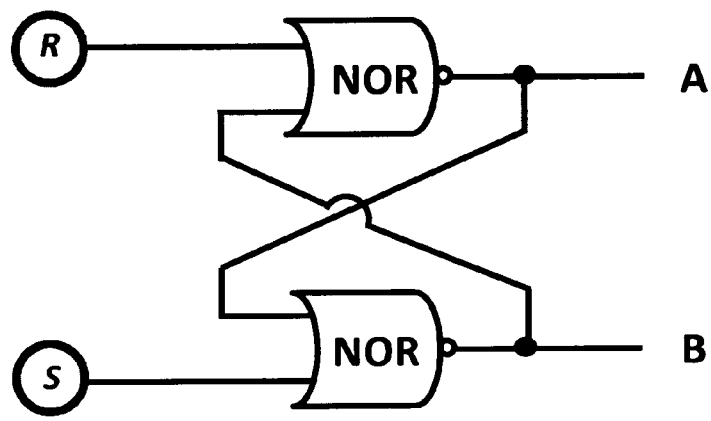
Figure 6:
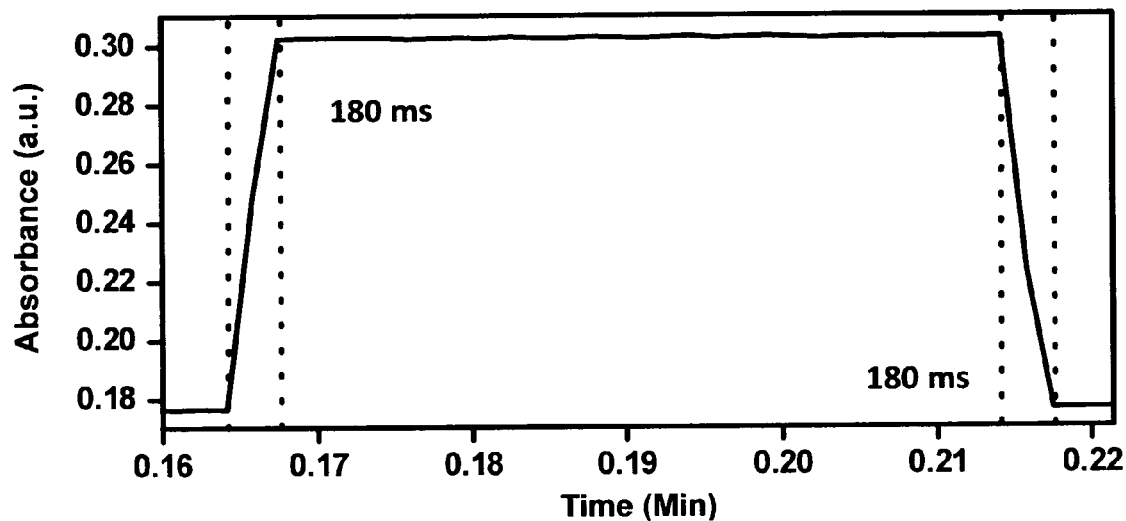
FIG. 6 shows the response time of molecular memory. Response time (ΔA>95%) of the 3-based assembly (19 deposition steps) upon changing from state 0 to state 1 and vice-versa.

The SPMA was used to demonstrate binary and ternary memory. If the input potentials were chosen at 0.60 and 1.30 V, the assembly was cycled between its two oxidation states ($Os^{2+/3+}$) and binary memory is created (FIG. 5A). This behaviour can be described in terms of sequential logic circuits (FIG. 5B). The presence or absence of the two applied input potentials is defined as a logical 1 or 0, respectively. The logic output 1 is defined when the absorption is below the threshold value of 0.18, whereas a logic 0 is produced when the absorption exceeds the threshold value of 0.29. In between those two values no stable state exists and the output is undefined. The generated circuit is equivalent to a flip-flop device, since it operates according to the characteristics table shown in Table 1. Applying 1.30 V will set the flip-flop in state 1, whereas a potential of 0.60 V will reset the flip-flop to state 0. When both voltages are absent, the circuit will keep it in the current state, and no change is induced.

Figure 7A:
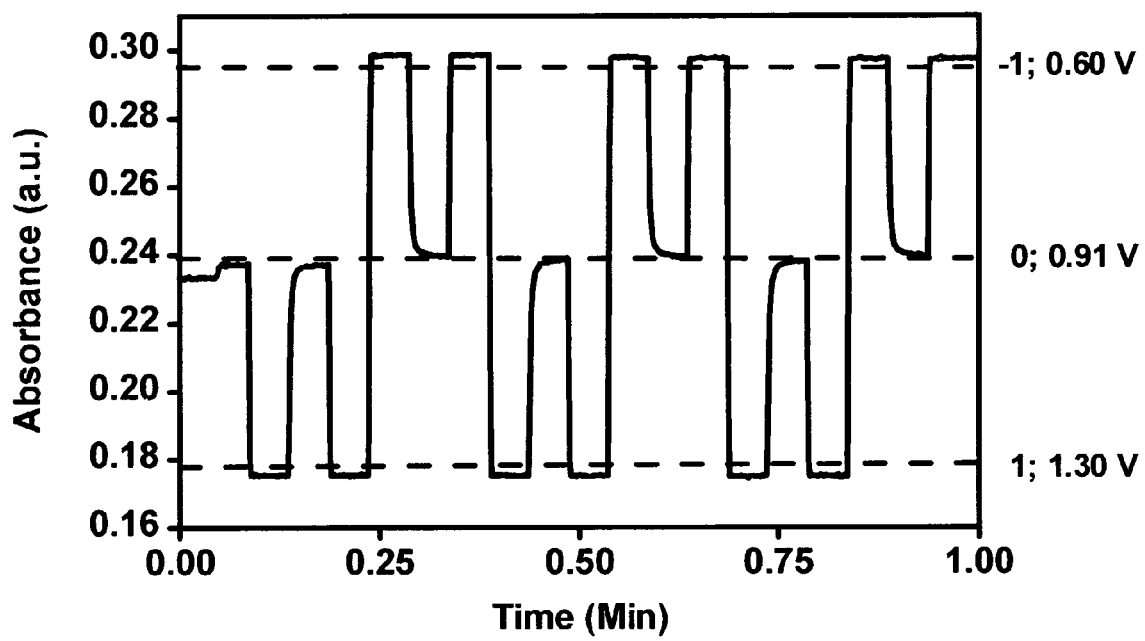
FIGS. 7A-7B show an electrically addressable flip-flap-flop device.
Figure 7B:
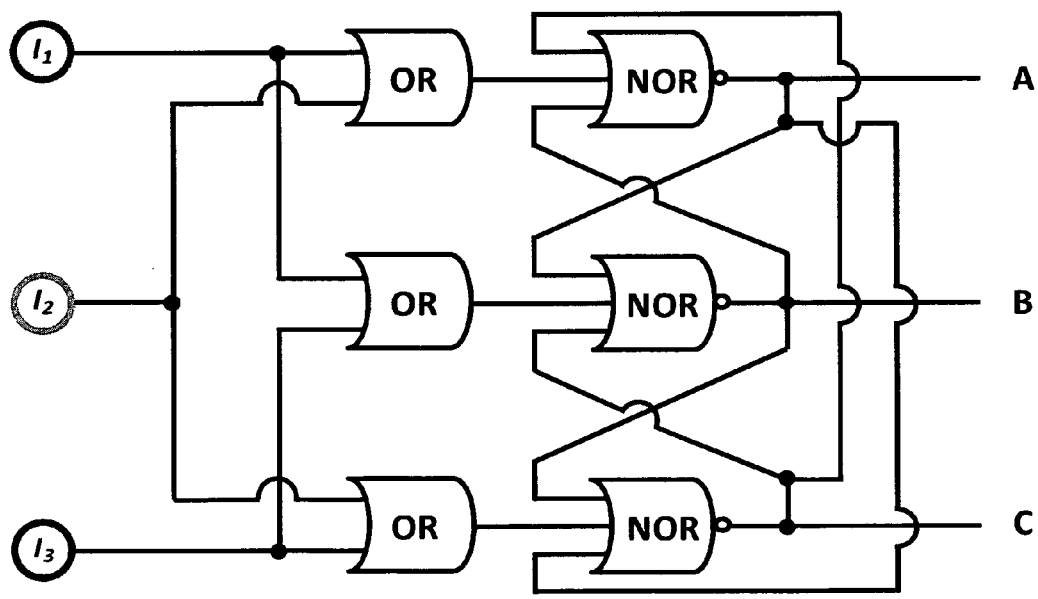
Figure 8A:
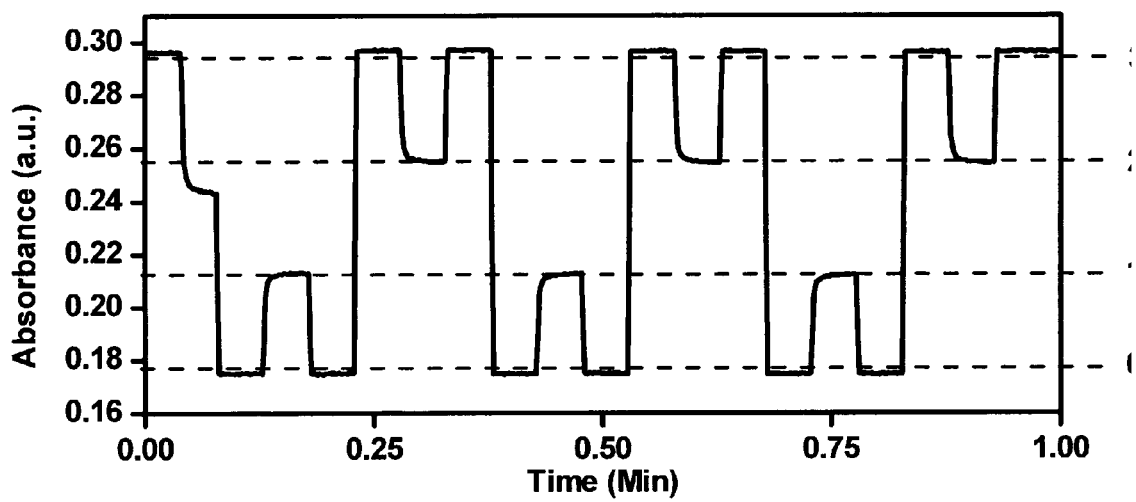
FIGS. 8A-8B show a dynamic access memory with four- and five states.
Figure 8B:
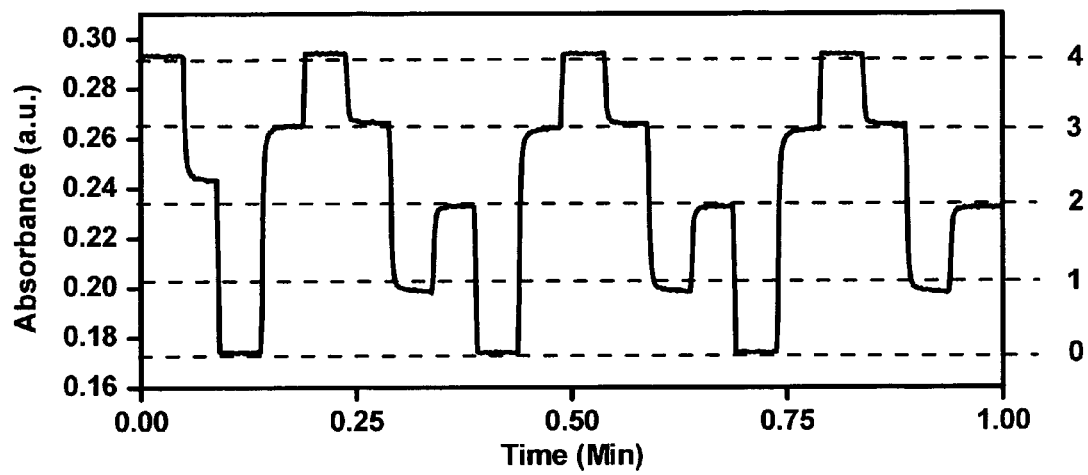

In contrast, if a third input potential at 0.91 V is introduced, an intermediate state is accessible in which the assembly is not fully oxidized or reduced and the assembly is of mixed valency (FIG. 7A). In this way, three accessible states are generated that allow the formation of ternary memory. In the absence of any inputs, the oxidation state of the SPMA is preserved within a certain time period and within predefined threshold values, and hence, no continuously applied potential is needed to maintain the current state. As indication, it takes ~25 minutes for full conversion from $Os^{3+}$ to $Os^{2+}$, which can be extended by avoiding trace amounts of $H_2O$. The observed retention times of the −1, 0, and 1 states of the ternary memory are 75, 110, and ∞ seconds, respectively. The electrical addressability is an improvement over our chemical addressable binary memory (vide supra), and en route towards all solid-state systems. However, the maximum time (180 ms) it takes for the SPMA to change its output from high-to-low or from low-to-high is slow. Although, this propagation delay of the electrical addressable SPMAs has been decreased by a factor of 2.0×10$^3$ compared with the chemically addressable monolayers, a conventional logic gate has a propagation delay of nanoseconds or lower.

In search for suitable materials and to expand the scope from molecular assemblies to polymers, we tested poly(3,4-ethylenedioxythiophene) (PEDOT). This electrochromic polymer is robust and operates at low potentials, making it a suitable candidate for demonstrating multi-state memory. Similar to our monolayers and the SPMA, we used here the optical absorbance as output signal (λ=630 nm), and various potentials as inputs. Also in this material, the absorbance is a precise function of the applied potential. The FWHM is considerably larger than for SPMA (0.4 V vs. 0.17 V). Moreover, the observed E½ is centered on −0.01 V (FIG. 10), which ensures that a device of the invention might work at a low power consumption. The good stability of the PEDOT, combined with a favorable FWHM, resulted in excellent retention times, and moreover, enabled us to demonstrate multi-state memory beyond ternary.

Figure 18A:
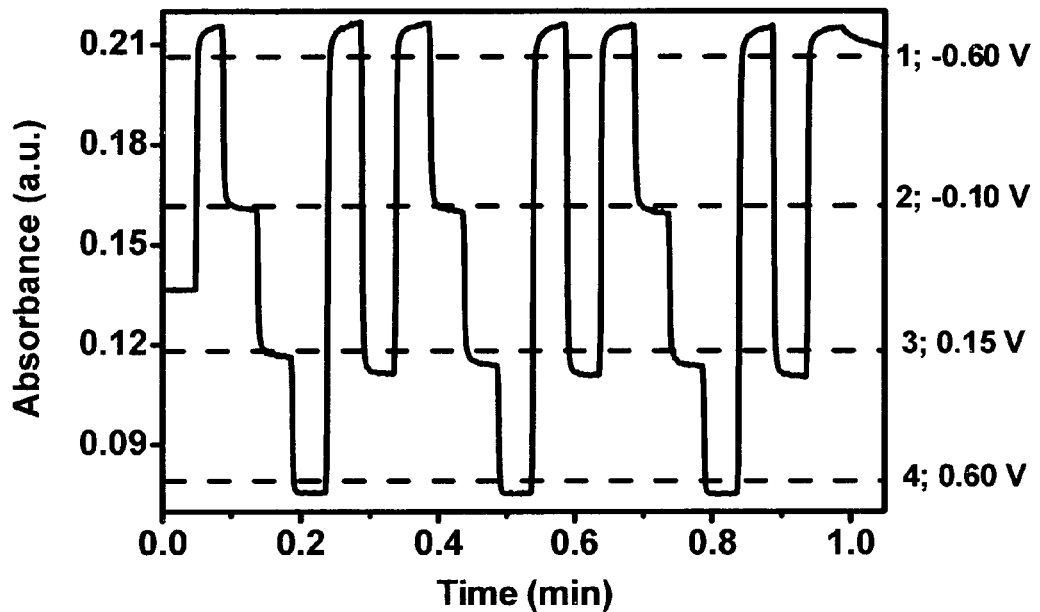
FIGS. 18A-18B show multiple absorbance states at λ=630 nm of the PEDOT-coated ITO.
Figure 18B:
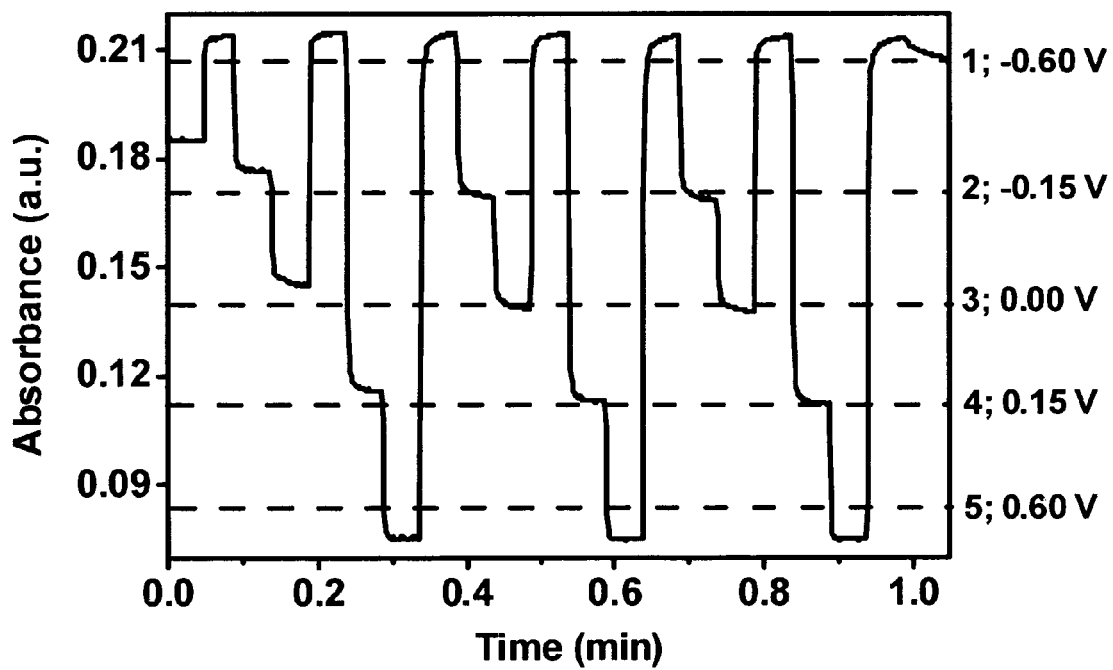

For example, the use of four input potentials (i.e., −0.60, −0.10, 0.15, and 0.60V), generates four distinct absorption values that represent the four states in the memory (FIG. 18A). In addition, the memory could be expanded to quinary memory by adding a potential value at 0.00 Volt (FIG. 18B). One might expand the number of states, provided that the ΔA of the absorption is sufficient, however, this would not be beneficial because the gain in efficiency (cost) decreases by incrementing the radix to a large extent.

Figure 19A:
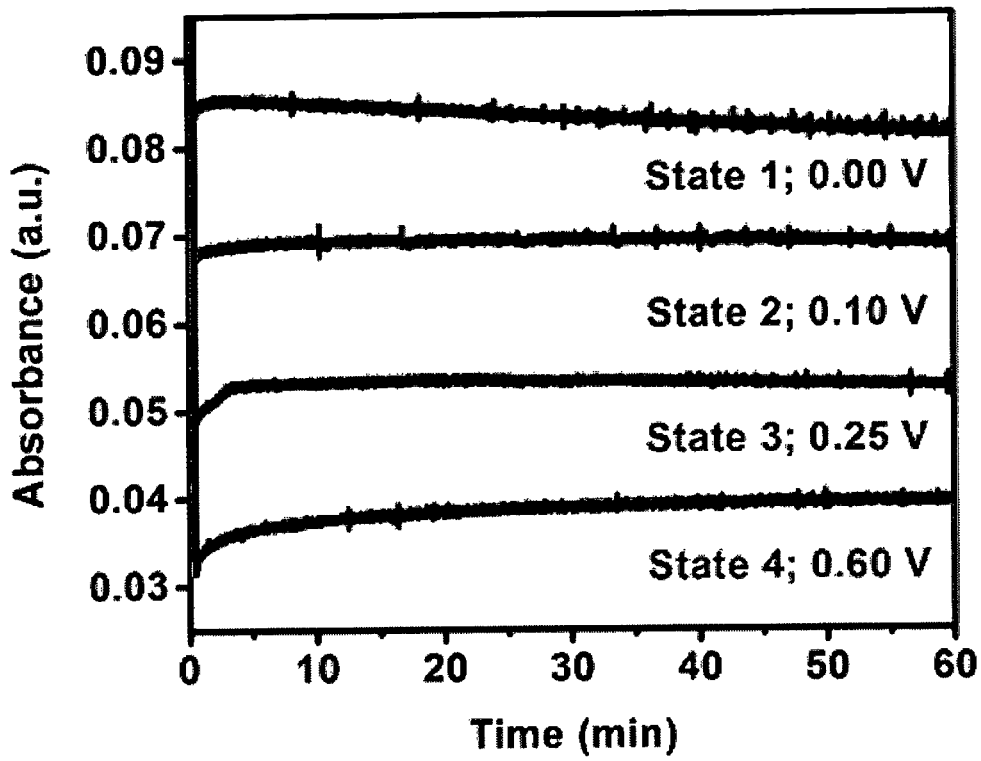
FIGS. 19A-19B show retention times of the absorbance band at λ=630 nm of the PEDOT-coated ITO after applying a multi-potential step with 3-s intervals.
Figure 19B:
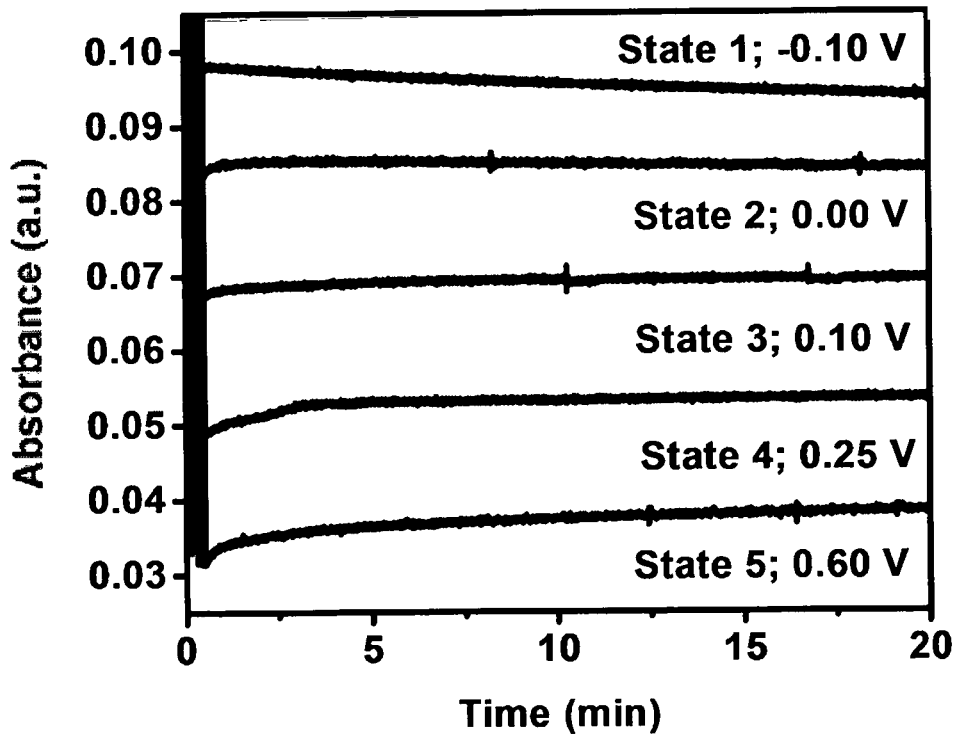

The input potentials can be reconfigured to increase the retention times of quaternary and quinary memory. The absorbance values are particularly stable between 0.00 and 0.60 V. Therefore, choosing the four and five potentials within this range resulted in retention times of 60 min for the quaternary memory and 20 min for the quinary memory (FIGS. 19A-19B). These retention times approach the range needed for the design of non-volatile memory. The presented memory is volatile (SRAM) and that the information is eventually lost. In this respect, the retention times of the PEDOT are excellent. However, the propagation delay of PEDOT is only 500 ms, which is a drawback for possible device performance.

Figure 17:
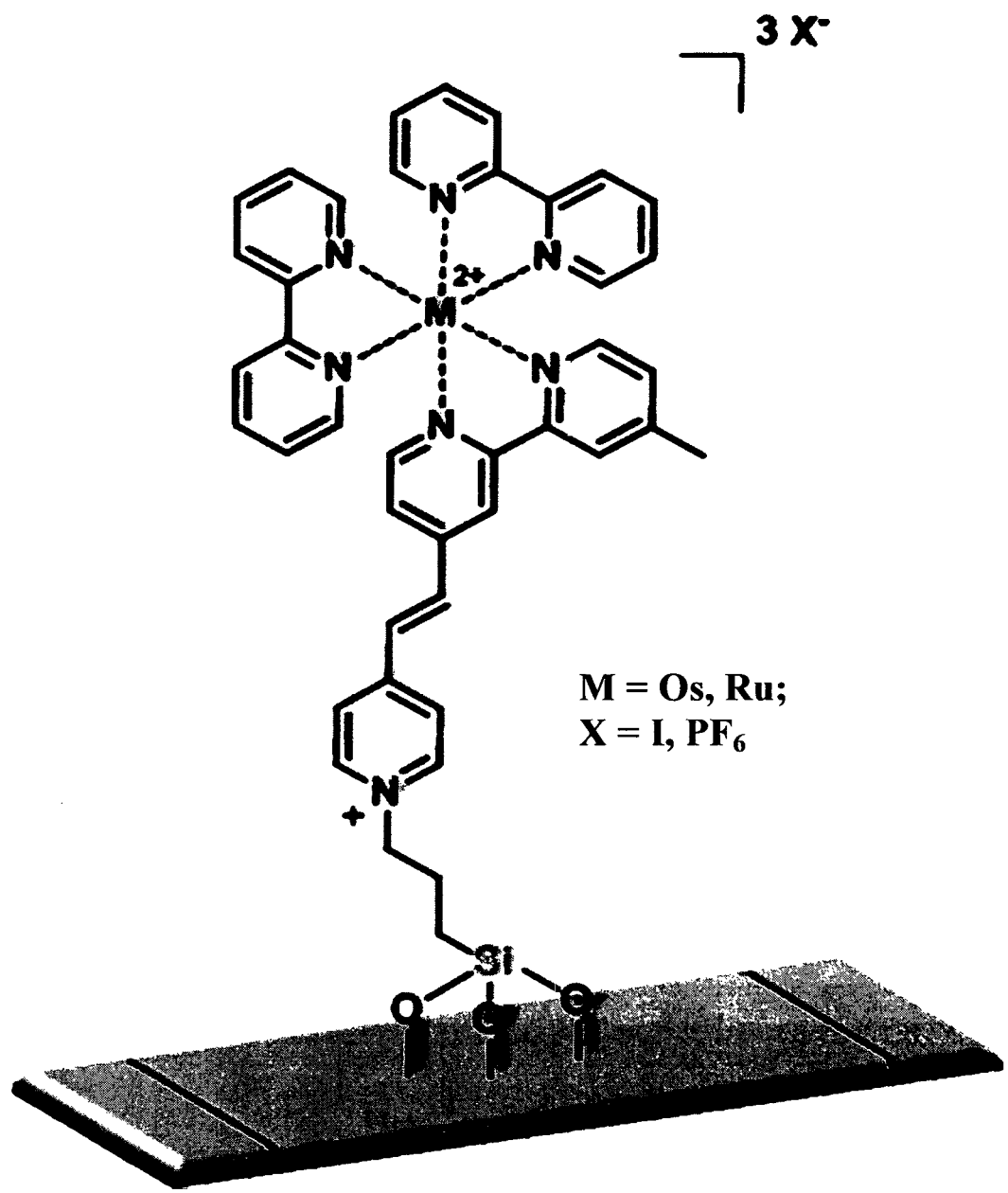
FIG. 17 shows a graphical representation of a polypyridyl complex used for the construction of a molecular Set/Reset (SR) flip-flop, covalently attached to a quartz surface.

Another non-limiting example for SPMA are osmium polypyridyl complexes of the type [Os(bpy)$_2$(mbpy-py)] [(PF$_6$)$_2$] such as bis(2,2'-bipyridine)[4'-methyl-4(2-(4-(3-propyl trimethoxysilane)pyridinium)ethenyl)-2,2'-bipyridine] Osmium(II) [tris(hexafluorophosphate)/tri-iodide] (FIG. 17), which when reduced have a characteristic metal-to-ligand charge-transfer (MLCT) band at λ=500 nm. However, when the Os metal-center is oxidized, this MLCT-band is bleached.

Since the memory device of the invention can be configured to store multiple values, the question arises how many values should be stored for an efficient operation. In Table 1, the numbers 1-6 (base 10) are represented with a different base or radix. As can be seen from the table, the smaller the radix, the more digits are required to represent each number. Consequently, a larger radix would require fewer digits; however, it requires more symbols to differentiate each number. Obviously, there is a relationship between the radix and the number of symbols, which needs to be optimized. If it is assumed that the radix is a continuous number, the optimal value would be Euler's number e. Therefore, base 3 rather than base 2 is mathematically the most efficient way to represent any given number, since it is the closest to the number e.

TABLE 1

Representation of the numbers 1-6 (base 10) in numerals with a different base, or radix

| Number | radix | | | | |
|---|---|---|---|---|---|
| | 1 | 2 | 3 | 4 | 5 |
| 1 | 1 | 1 | 1 | 1 | 1 |
| 2 | 1 1 | 1 0 | 2 | 2 | 2 |
| 3 | 1 1 1 | 1 1 | 1 0 | 3 | 3 |
| 4 | 1 1 1 1 | 1 0 0 | 1 1 | 1 0 | 4 |
| 5 | 1 1 1 1 1 | 1 0 1 | 1 2 | 1 1 | 1 0 |
| 6 | 1 1 1 1 1 1 | 1 1 0 | 2 0 | 1 2 | 1 1 |

The unit of the molecular RAM device of the invention can be prepared according to known methods in the literature (Altman et al., 2006; Motiei et al., 2008) using known substrates as described hereinabove and electrochromic, magnetic, redox-active or photochromic materials and conductive layer or layers.

In general, a conductive substrate is first functionalized in order to improve the adhesion of layers deposited on the conductive substrate. The functionalized conductive substrate is then immersed into a (heated) solution of electrochromic, magnetic, redox-active or photochromic material forming a first layer. Subsequent layers can be obtained by drying the conductive substrate and immersing it again into a heated solution of identical or different materials. The top conductive layer can be produced using standard deposition methods, including spin-coating, drop-casting, solution-based deposition, vapor phase deposition, metal-organic chemical vapor deposition (MOVCD), atomic layer deposition (ALD), electrochemical deposition, polymerization, pulsed laser deposition, chemical vapor deposition (CVD), plasma enhanced chemical vapor deposition (PECVD), spray coating, dip coating, or layer-by-layer assembly.

For example, a template layer was prepared as follows: first a substrate was functionalized by siloxane-based coupling layers, after drying the functionalized substrate was immersed into a solution of electrochromic, redox active, magnetic or photochromic material, such as tris(4-[2-(4-pyridyl)ethenyl]-4'-methyl-2,2'-bipyridine Osmium(II) bis (hexafluorophosphate), herein identified as complex 3, and heated for 96 h at 80° C. with the exclusion of light. After washing with acetonitrile and sonication for 5 min each in acetonitrile and isopropanol, the samples were wiped and dried under a stream of N$_2$. The multilayers of electrochromic materials, FIG. 2, were prepared as follows: functionalized substrates were immersed for 15 min, at room temperature in a 1 mM solution of PdCl$_2$(PhCN)$_2$ (prepared according to Anderson et al., 1990) in THF. The samples were then sonicated twice in THF and once in acetone for 3 min each. Subsequently, the samples were immersed for 15 min in a 0.2 mM solution of complex 3 in THF/DMF (9:1, v/v) at room temperature. The samples were then sonicated twice in THF and once in acetone for 5 min each. This procedure was repeated at least 10 times. Finally, the samples were rinsed in ethanol and dried under a stream of N$_2$.

The unit of the molecular RAM device of the invention comprises one or more layers of electrochromic, magnetic, redox-active material or photochromic materials. The unit can comprise one or more layers of electrochromic, redox-active material, magnetic or photochromic materials. The layers may be built with identical or different layers of electrochromic, redox-active material, magnetic or photochromic materials. It is also possible to have one or more layers of electrochromic materials and one or more layers of photochromic materials or one or more layers of redox active material.

The term "redox-active material" refers to materials that can change their oxidation number (or state) by (reversibly) losing or gaining one or multiple electrons. Non limiting examples include Ru(bpy)$_3$, Os(bpy)$_3$, Fe(bpy)$_3$. In one embodiment an electrochromic material is a redox-active material.

The conductive top layer of the unit comprises a thin metal film or a conductive polymer such as Nafion, poly(acetylene)s, poly(pyrrole)s, poly(thiophene)s, polyanilines, polythiophenes, poly(p-phenylene sulfide), poly(p-phenylene vinylene)s (PPV), polyindole, polypyrene, polycarbazole, polyazulene, polyazepine, poly(fluorene)s, or polynaphthalene.

The memory reader reads the optical state of the unit. Memory readers can be made to read the optical state in different ways such as optically, electrochemically, magnetically, electronically, reading changes in conductivity, refractive index readout, magnetic properties, infrared (IR) readout.

EXAMPLES

Example 1

Preparation of tris(4-[2-(4-pyridypethenyl]-4'-methyl-2,2'-bipyridine Cobalt(II) bis(hexafluorophosphate) ([Co(mbpy-py)$_3$1(PF$_6$)$_2$), herein identified as complex 1

A solution of CoCl$_2$.6H$_2$O (Sigma Aldrich; 274 mg, 1 mmol) and 4-[2-(4-pyridyl)ethenyl]-4'-methyl-2,2'-bipyridine (prepared according to Motiei et al., 2008, 2009; 850 mg; 3.1 mmol) in 100 mL MeOH was stirred for 15 min under slight heating. The resulting yellow solution was evaporated under vacuum, and the remaining solid re-dissolved in 10 mL of H$_2$O. To the resulting yellow solution was added an aqueous solution of NH$_4$PF$_6$ (Sigma Aldrich, 1000 mg in 6 mL H$_2$O), resulting in the precipitation of a yellow solid. The precipitate was filtered-off, washed with copious amount of H$_2$O (100 mL) and Et$_2$O (250 mL), to afford [Co(mbpy-py)$_3$](PF$_6$)$_2$ 1 as a yellow/brown solid (968 mg; 83%). UV/Vis (acetonitrile): $\lambda_{max}$ ($\epsilon$)=307 nm (88.6 $^a$ 10$^3$). Cyclic Voltammetry (CV, acetonitrile; 0.1 M NBu$_4$BF$_4$): E$_{1/2}$=0.32 V.

Example 2

Preparation of tris(4-[2-(4-pyridyl)ethenyl]-4'-methyl-2,2'-bipyridine) Ruthenium(II) bis(hexafluorophosphate) ([Ru(mbpy-py)$_3$](PF$_6$)$_2$), herein identified as complex 2

Under Argon, a solution of RuCl$_3$.3H$_2$O (Next Chimica; 262 mg, 1 mmol) and 4-[2-(4-pyridyflethenyl]-4'-methyl-2,2'-bipyridine (prepared according to Motiei et al., 2008, 2009; 850 mg; 3.1 mmol) in 100 mL Et(OH)$_2$ was stirred for 15 h at 140° C. To the resulting dark orange solution was added an aqueous solution of NH$_4$PF$_6$ (Sigma Aldrich, 1000 mg in 150 mL H$_2$O), resulting in the precipitation of a red solid. The precipitate was filtered-off, washed with copious amount of H$_2$O (100 mL) and Et$_2$O (250 mL), to afford [Ru(mbpy-py)$_3$](PF$_6$)$_2$ 2 as a red solid (755 mg; 62%).

Example 3

Formation of a Template Layer

Siloxane-based coupling layers were prepared on freshly cleaned float glass, quartz and Si(100) in a N$_2$-filled glove box. The substrates were treated with a dry pentane solution of p-chloromethylphenyltrichlorosilane (Gelest; 1:200 v/v) at room temperature for 20 min under N$_2$. The substrates were then thoroughly washed with copious amounts of dry pentane, and sonicated (3 min) with pentane, CH$_2$Cl$_2$ and isopropanol. The resulting films dried under a stream of N$_2$, and dried at 130° C. for 15 min. Subsequently, the functionalized substrates were loaded into a pressure vessel and immersed in dry acetonitrile/toluene (1:1 v/v) solution of complex 1 (0.1 mM) and heated for 96 h at 80° C. with the exclusion of light.

The functionalized substrates were then rinsed with acetonitrile and sonicated for 5 min each in acetonitrile and isopropanol. The samples were then carefully wiped with a task wipe and dried under a stream of N$_2$.

Example 4

Formation of Mixed Multilayers

Functionalized substrates (ITO) are loaded onto a Teflon holder and immersed for 15 min, at room temperature, in a 1 mM solution of PdCl$_2$(PhCN)$_2$ (prepared according to Anderson et al., 1990) in THF. The samples are then sonicated twice in THF and once in acetone for 3 min each. Subsequently, the samples are immersed for 15 min in a 0.2 mM solution of complex 1 in THF/DMF (9:1, v/v) at room temperature. The samples are then sonicated twice in THF and once in acetone for 5 min each. Hereafter the samples are immersed for 15 min, at room temperature, in a 1 mM solution of PdCl$_2$(PhCN)$_2$ in THF. The samples are then sonicated twice in THF and once in acetone for 3 min each. Next, the samples are immersed for 15 min in a 0.2 mM solution of complex 2 in THF/DMF (9:1, v/v) at room temperature.

Figure 2:
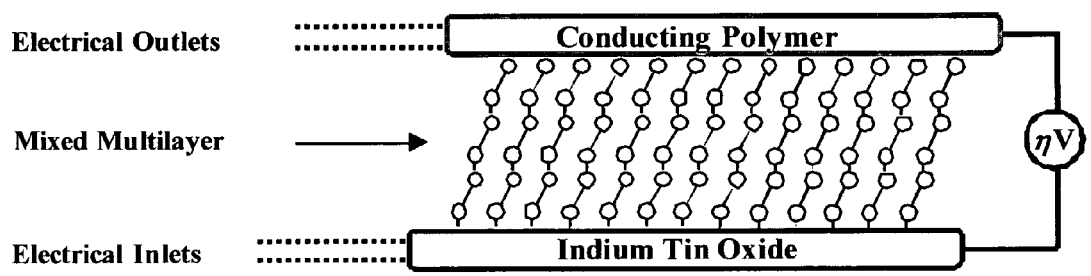
FIG. 2 shows a schematic representation of a solid-state device constructed from a mixed multilayer, with electrochromic, redox-active, or photochromic materials (i.e. polypyridyl complex) deposited on said conductive layer (i.e. ITO), with a conductive top-layer. The setup is electrical addressable (0-2 V) and allows for the electrical manipulation of optical and electrical properties of the device, which is now able to store a plurality of distinct physical states (for example, $Co^{2+}/Ru^{2+}$, $Co^{3+}/Ru^{2+}$ and $Co^{3+}/Ru^{3+}$).

This procedure was repeated at least 5 times. Finally, the samples are rinsed in ethanol and dried under a stream of N$_2$. FIG. 2 shows a schematic representation of a solid-state device constructed from a mixed multilayer, with for example polypyridyl complexes, on a conductive layer (i.e. ITO), with a conductive top-layer. The setup is electrical addressable (0-2 V) and allows for the electrical manipulation of optical and electrical properties of the device, which is now able to store a plurality of distinct physical states (for example, Co$^{2+}$/Ru$^{2+}$, Co$^{3+}$/Ru$^{2+}$ and Co$^{3+}$/Ru$^{3+}$).

Example 5

In the following set of experiments, an Os-polypyridyl-based (FIG. 3), assembly, herein referred to as 3-based assembly, (prepared according to Motiei et al. 2008, 2009), was used to construct the molecular memory, since its optical output is a precise function of the applied voltage FIGS. 4A-4B). Therefore, multi-valued information can be written on to the assembly by applying specific potential biases (vs Ag/AgCl). The read & write cycle is completed by monitoring the metal-to-ligand charge-transfer (MLCT) band at $\lambda$=510 nm, which can be read-out by a conventional UV-vis spectrophotometer. Interestingly, the read & write operations are fundamentally different: optical and electrochemical, respectively. The optical read-out is non-destructive and allows instantaneous data transfer.

5.1 Materials and Methods

The Os-based assemblies on ITO substrates were produced by a step-wise deposition as previously reported (Motiei et al., 2008; Motiei et al., 2009). p-Chloromethylphenyltrichlorosilane and tetrabutylammoniom tetrafluoroborate (TBABF$_4$) were purchased from Gelest and Aldrich, respectively. Solvents (AR grade) were purchased from Bio-Lab (Jerusalem), Frutarom (Haifa), or Mallinckrodt Baker (Phillipsburg, N.J.). Pentane and toluene were dried and purified using a M. Braun solvent purification system and stored in a M. Braun glove box with O$_2$ and H$_2$O levels <2 ppm. Single-side Indium Tin Oxide (ITO)-coated float glass substrates (8-12$\Omega$) were purchased from Delta Technologies (Stillwater, Minn.) and cleaned by sonication for 10 min in hexane, acetone and ethanol. Thereafter, the substrates were dried under a gentle stream of N$_2$ and treated for 20 min with UV and ozone in a UVOCS cleaning system (Montgomery, Pa.).

The substrates were subsequently washed with iso-propanol and dried in an oven for 2 h at 130° C. UV/vis spectra were recorded on a Cary 100 spectrophotometer. Electrochemical measurements were performed on a CHI 660A potentiostat with ITO, platinum and Ag/AgCl as a working, counter and reference electrode, respectively. All measurements were carried out in acetonitrile with TBABF$_4$ (0.1 M) as electrolyte in the multi-potential chronoamperometric mode at 298 K unless stated otherwise.

5.2 Multi-Potential Switching of the Absorbance of the 3-Based Assembly

The 3-based assembly was oxidized and reduced by applying double-potential steps, with 1-s intervals, between 0.60 V and (0.60+n0.05 V) with n=1–14. Monitoring the MLCT band at λ=510 nm resulted in accurate control over the transparency of the assembly film, because ΔA is a function of the voltage until full oxidation is achieved, as illustrated in FIG. 4A.

5.3 Multi-State Memory with the 3-Based Assembly

The segmented absorption values of the 3-based monolayer allow one to construct memory elements that are capable of existing in up to 5 states. In a typical experiment, an electrochemical potential was applied for 3 seconds, before another pulse was applied at a different potential. This was repeated with 2, 3, 4 and 5 different potential values. This results in a platform that is capable of storing binary, balanced ternary, quaternary and pentanary digits (FIGS. 5A, 7A, and 8A-8B).

5.4 Bi/Trit Retention Time of the 3-Based Assembly

Figure 9A:
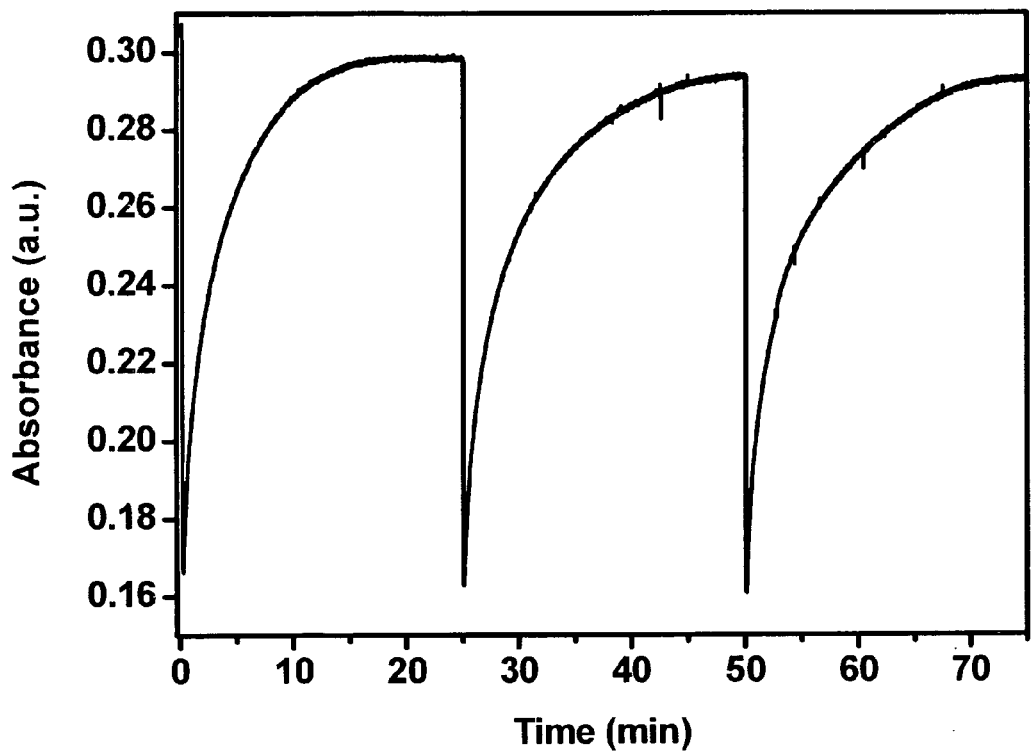
FIGS. 9A-9B show the absorbance of the MLCT band at λ=510 nm of the 3-based assembly (17 layers), as a function of time upon applying a double-potential step between 0.6 and 1.3 V, with 1-s intervals, for 2½ cycles.
Figure 9B:
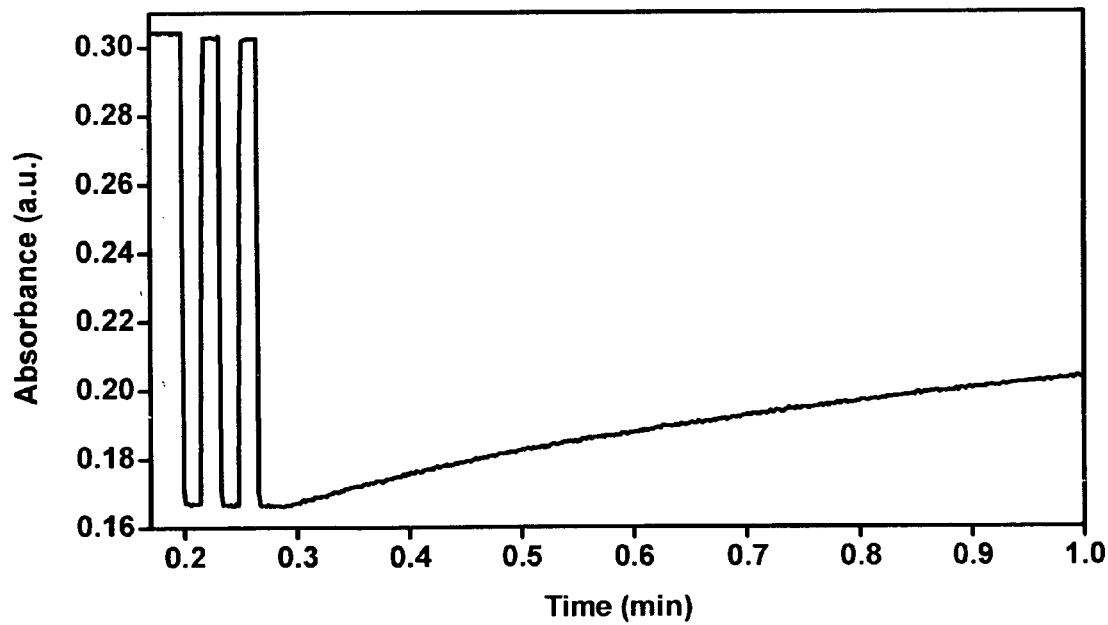

The bit/trit retention time of the 3-based assembly was investigated by applying a double potential-step, with 1-s intervals, between 0.60 and 1.30 V for 2½ cycles, to demonstrate reversibility; thereafter the conversion from $Os^{3+}$ to $Os^{2+}$ was monitored at λ=510 nm, as a function of time. The complete conversion from $Os^{3+}$ to $Os^{2+}$ occurs in approximately 25 min (FIG. 9). The retention times for the binary memory can be calculated by using 0.17-0.232 (150 s) and 0.26-0.30 (∞) as a threshold values, whereas the retention times for the ternary memory can be calculated according to the threshold values of 0.17-0.21 (75 s) and 0.24-0.26 (230 s) and 0.26-0.30 (∞) respectively.

Example 6

Generation of Multi-State Memory Using Commercially Available poly(3,4-ethylenedioxythiophene) (PEDOT)

The multi state memory can be constructed with a wide variety of electrochromic materials. Below is demonstrated similar electrochromic behavior of commercially available poly(3,4-ethylenedioxythiophene) (PEDOT) compared to the polypyridyl complexes 1-3.

6.1 Materials and Methods

The PEDOT coated Indium Tin Oxide (ITO) substrates were produced by electrochemical deposition from solution as previously reported in Aleshin et al. (1997). Single-side ITO-coated float glass substrates (8-12Ω) were purchased from Delta Technologies (Stillwater, Minn.) and cleaned by rinsing with acetone and alcohol. UV/vis spectra were recorded on a Cary 100 spectrophotometer. Electrochemical measurements were performed on a CHI 660A potentiostat with ITO, platinum, and Ag/AgCl as a working, counter, and reference electrode, respectively. All measurements were carried out in acetonitrile with TBABF$_4$ (0.1 M) as electrolyte in the multi-potential chronoamperometric mode at 298 K unless stated otherwise.

6.2 Multi-Potential Switching of the Absorbance of the PEDOT Coated ITO

Figure 10:
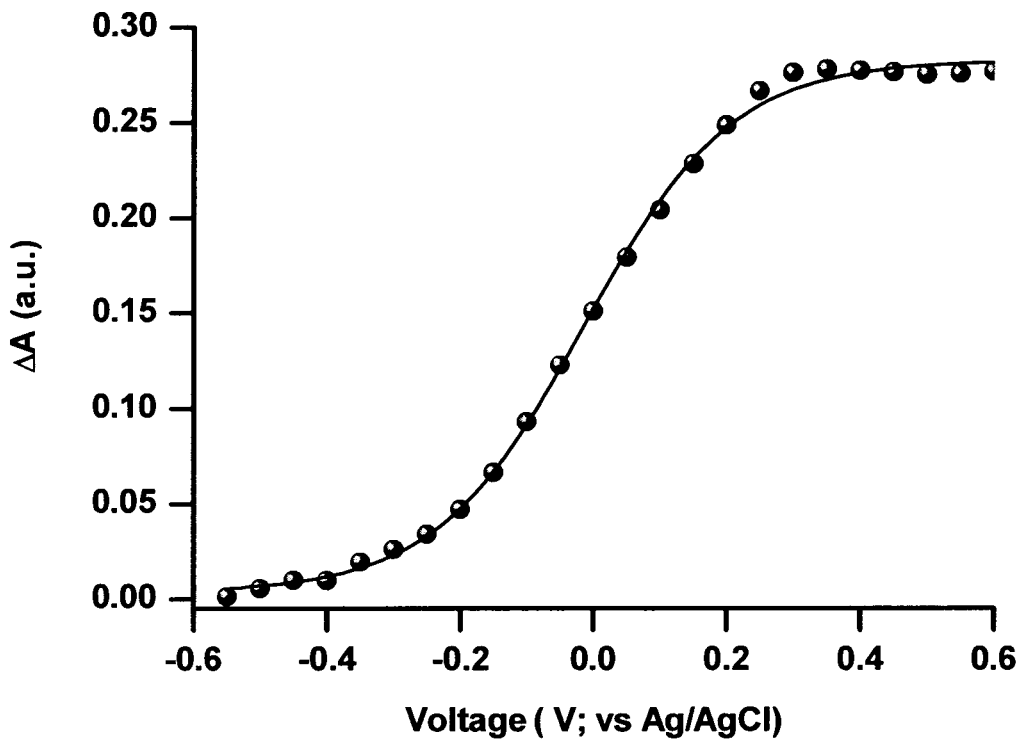
FIG. 10 shows difference in absorbance (AA) of the absorbance band at λ=630 nm of the PEDOT coated ITO, as a function of the voltage, upon applying double-potential steps, with 1-s intervals, between −0.60 V and (−0.60 V +n0.05 V), with n=1-24. Each dot represents the average of 10 double-potential cycles. The continuous line is a sigmoidal fit ($R^2$=0.99868) of the data, with an inflection point at −0.01 V.

The PEDOT coated ITO was oxidized and reduced by applying double-potential steps, with 1-s intervals, between −0.60 V and (−0.60+n0.05 V) with n=1-24. Monitoring the band at λ=630 nm resulted in accurate control over the transparency of the multilayer film, because ΔA is a function of the voltage until full oxidation is achieved, as illustrated in FIG. 10.

6.3 Absorbance Switching Between Multiple Potential Segments

Figure 11A:
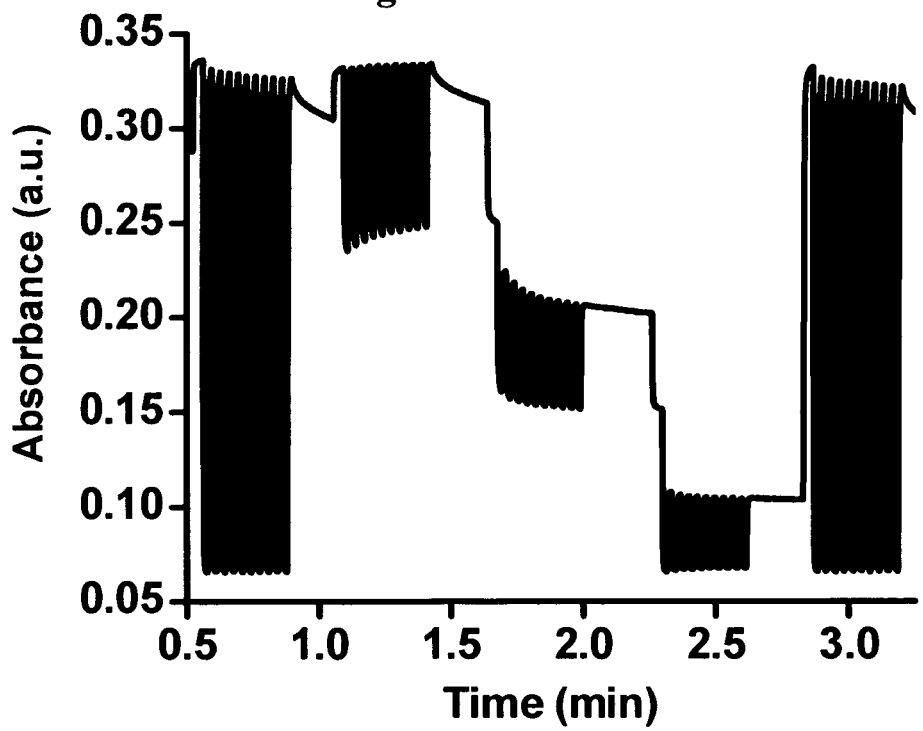
FIGS. 11A-11C show absorbance of $\lambda_{max}$ at 630 nm of the PEDOT coated indium tin oxide, as a function of time upon applying double-potential steps, with 1-s intervals, for 10 consecutive cycles.
Figure 11B:
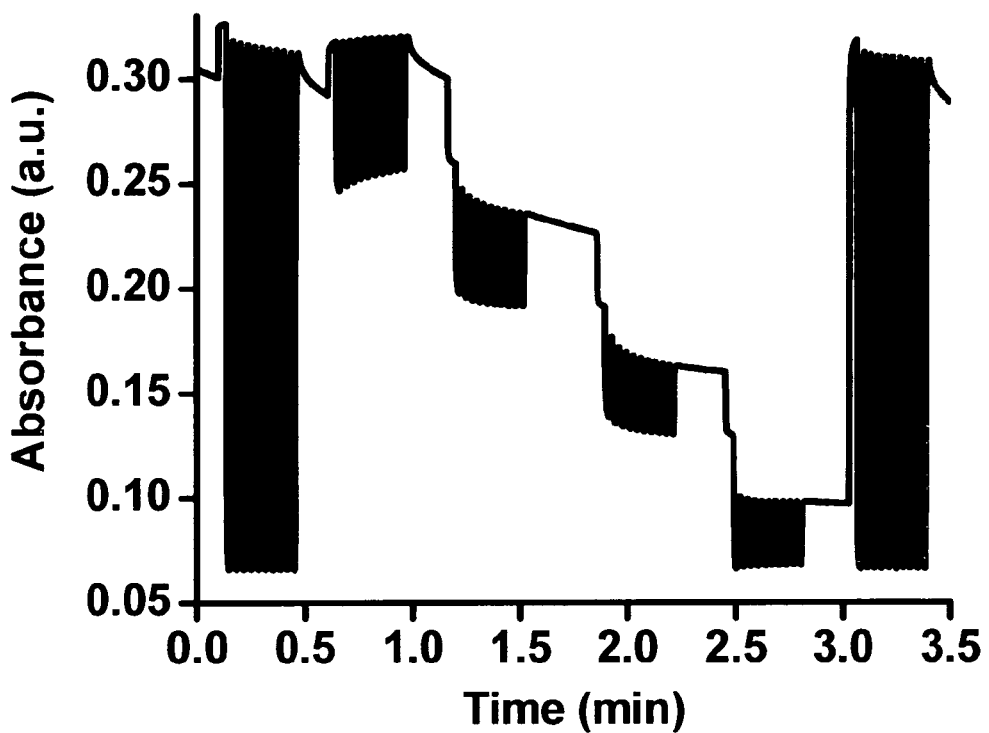
Figure 11C:
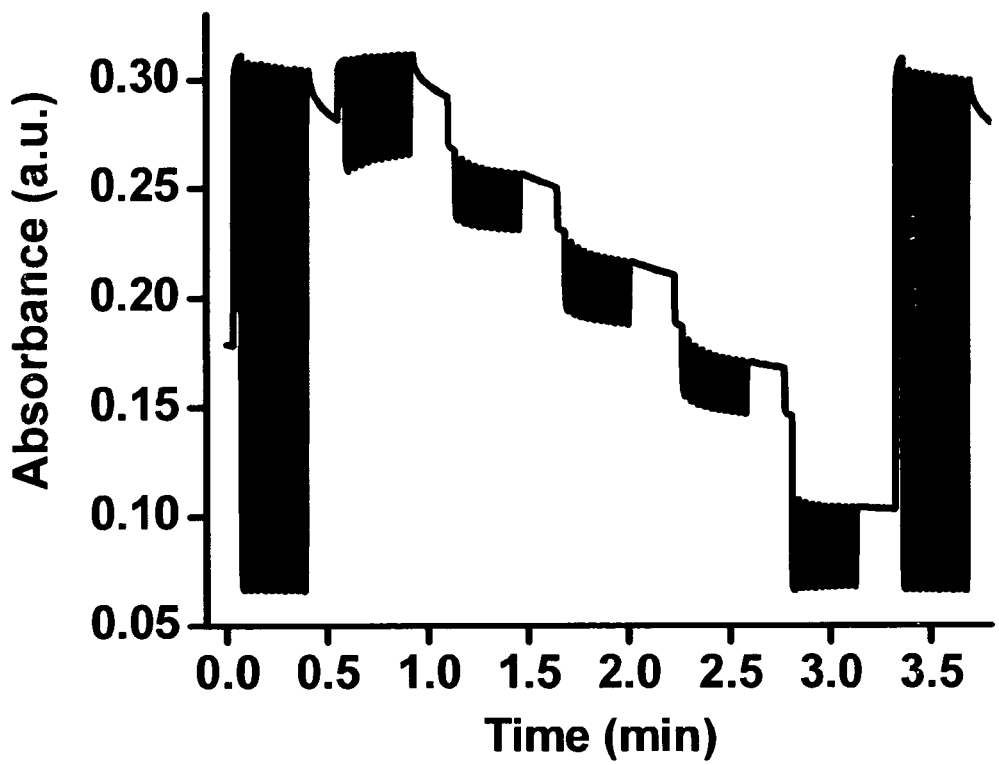

The PEDOT coated ITO was partially oxidized and reduced by switching the electrochemical potential between segmented values. For instance, the absorbance was split into three regions by applying a double-potential step, with 1-s intervals, between −0.60--0.10 V; −0.10-0.1 V and 0.10-0.60 V, respectively. This resulted in three distinct regions of absorption values that are highly reproducible (FIG. 11A). Furthermore, the absorption values can furthermore be split, into 4 and 5 regions, by segmenting the electrochemical potential accordingly (FIGS. 11B-11C).

6.4 Binary and Ternary Memory with PEDOT Coated ITO

Figure 12A:
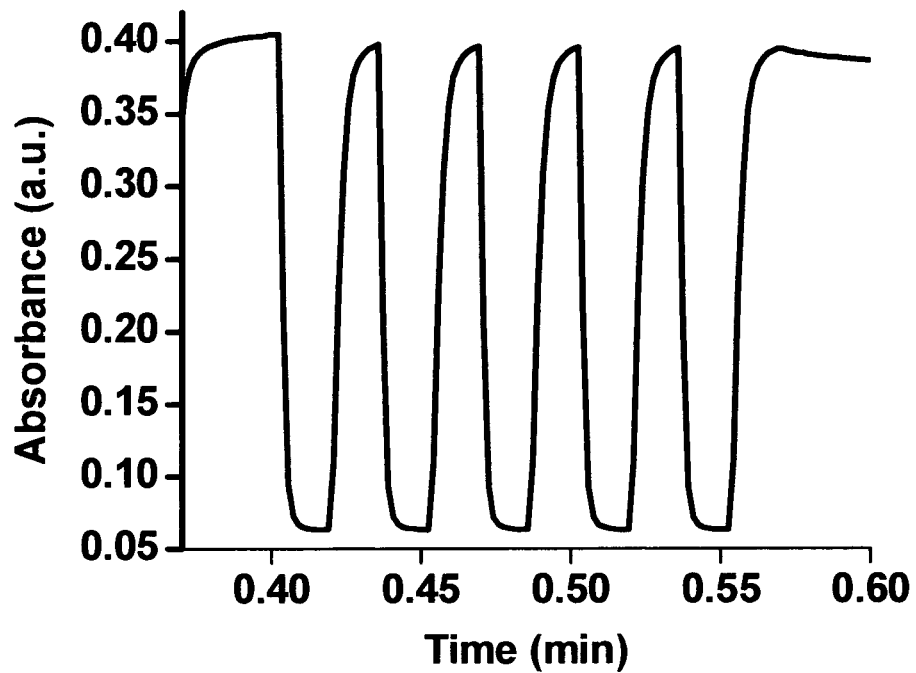
FIGS. 12A-12B show absorbance of $\lambda_{max}$ at 630 nm of the PEDOT coated indium tin oxide, as a function of time upon applying multi-potential step with 3 seconds intervals.
Figure 12B:
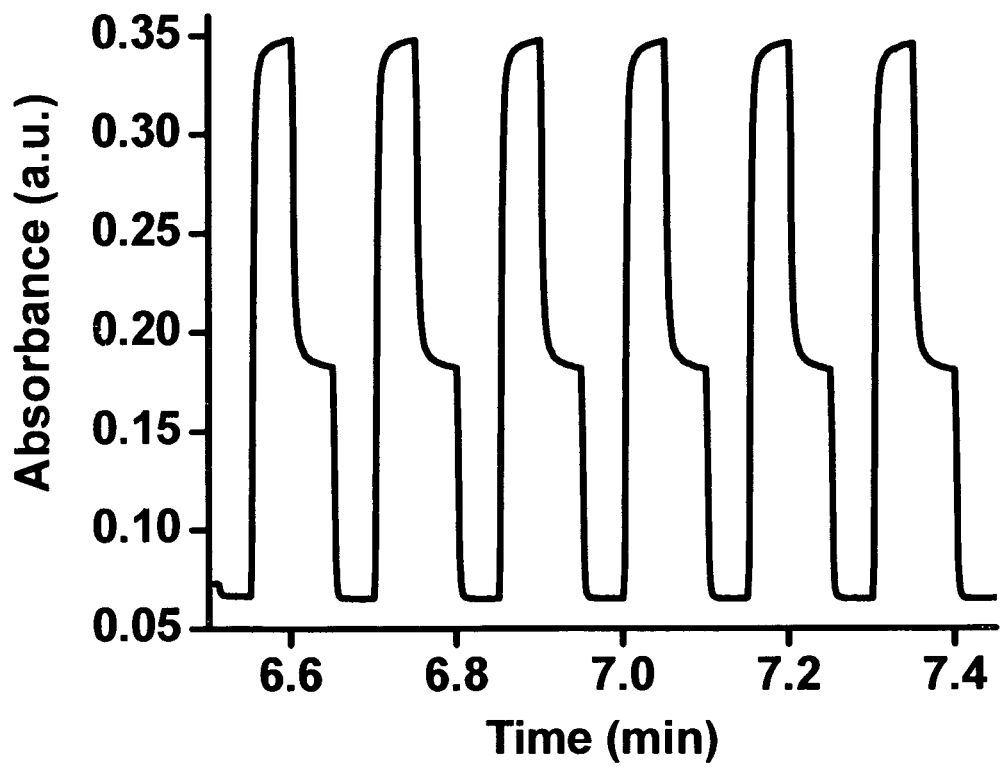

The segmented absorption values of the PEDOT coated ITO, allows one to construct memory elements that are capable of existing in up to 5 states. Binary and ternary memories were created by applying an electrochemical potential for 3 seconds, before another pulse was applied at a different potential. This was performed with two and three different potential values. This resulted in a reproducible platform that is capable of ternary digits (FIGS. 12A-12B)

6.5 Retention Time of the PEDOT Coated ITO

Figure 13A:
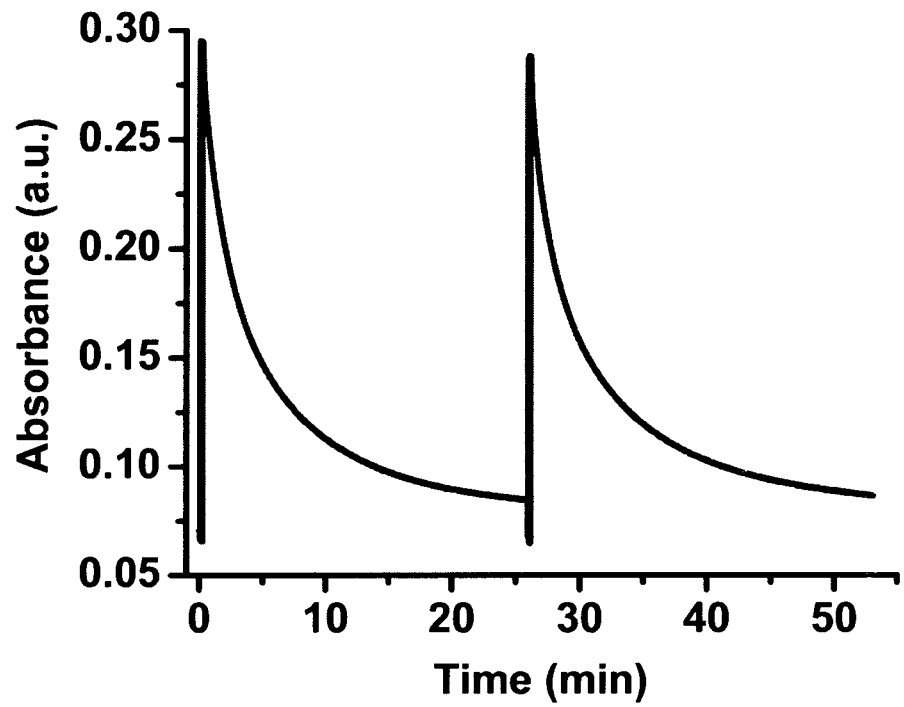
FIGS. 13A-13B show absorbance of $\lambda_{max}$ at 630 nm of the PEDOT coated indium tin oxide, as a function of time upon applying a double-potential step between −0.60 and 0.60 V, with 1-s intervals, for 2½ cycles, with subsequent monitoring of the conversion from $PEDOT_{ox}$ to $PEDOT_{red}$.
Figure 13B:
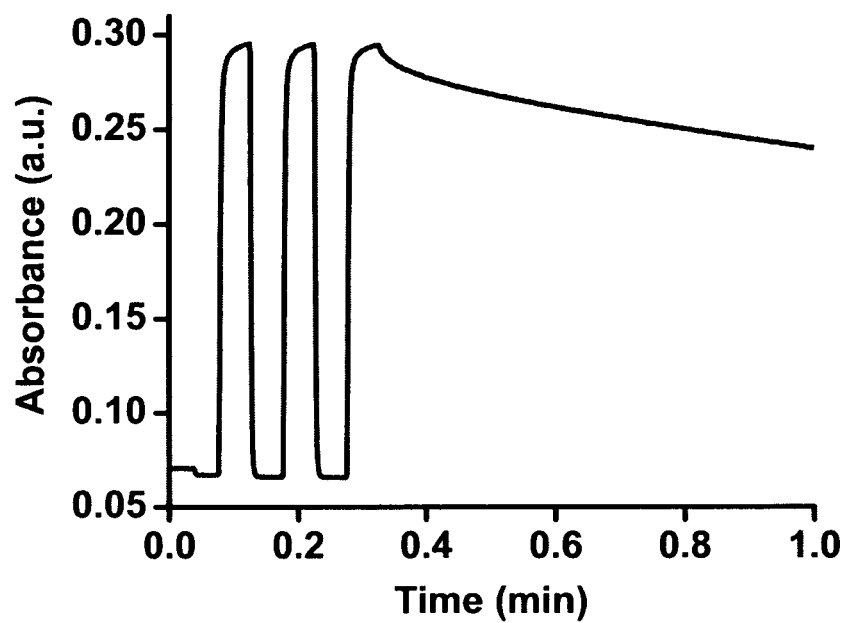

The bit/trit retention time of the PEDOT coated ITO was investigated by applying a double potential-step, with 1-s intervals, between 0.60 and −0.60 for 2½ cycles, to demonstrate reversibility. Thereafter the conversion from $PEDOT_{ox}$ (ox-oxidized) to $PEDOT_{red}$ (red=reduced) was monitored at λ=630 nm, as a function of time. ~90% conversion from $PEDOT_{ox}$ to $PEDOT_{red}$ occured in approximately 25 min (FIGS. 13A-13B).

6.6 Electrochemical Read-Out of Binary Memory

In addition to the optical read-out (e.g. UV vis) used in Examples above, the memory could potentially be read-out electrochemically. In the experiment below, we demonstrated how this could be realized by using a cyclic voltammetry. Specifically this has been demonstrated with a >25 nm thick Os-based multilayer.

Figure 14:
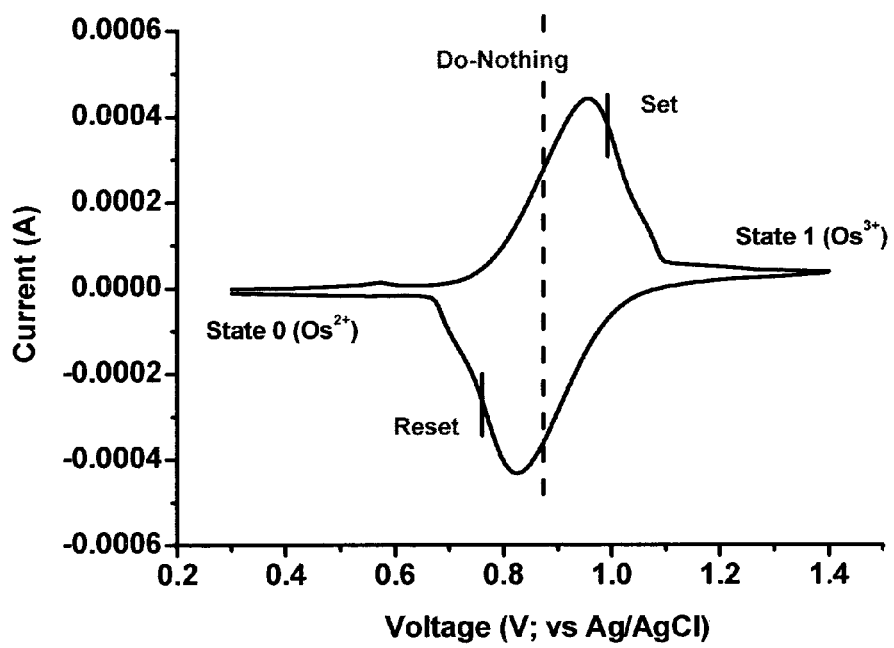
FIG. 14 shows a cyclic voltammogram of a >25 nm thick Os-based (3-based assembly) multilayer, recorded at a scan rate of 50 mV/s from 0.25-1.4 V. The text inside the figure indicates the possible set/reset and the do-nothing potentials associated with the flip-flop behavior of the film.

A 23-layer Os-based multilayer (>25 nm thick) film on ITO is used as working electrode in an electrochemical cell (MeCN; 0.1 M TBABF$_4$) with Ag/AgCl and platinum as reference and counter electrode, respectively. The cyclic voltammogram was recorded at a scan rate of 50 mV/s from 0.25-1.4 V. The definition of the set and reset is based on the cyclic voltammogram as presented in FIG. 14 (method of measurement explained in Pariyasami et al., 2010).

Figure 16:
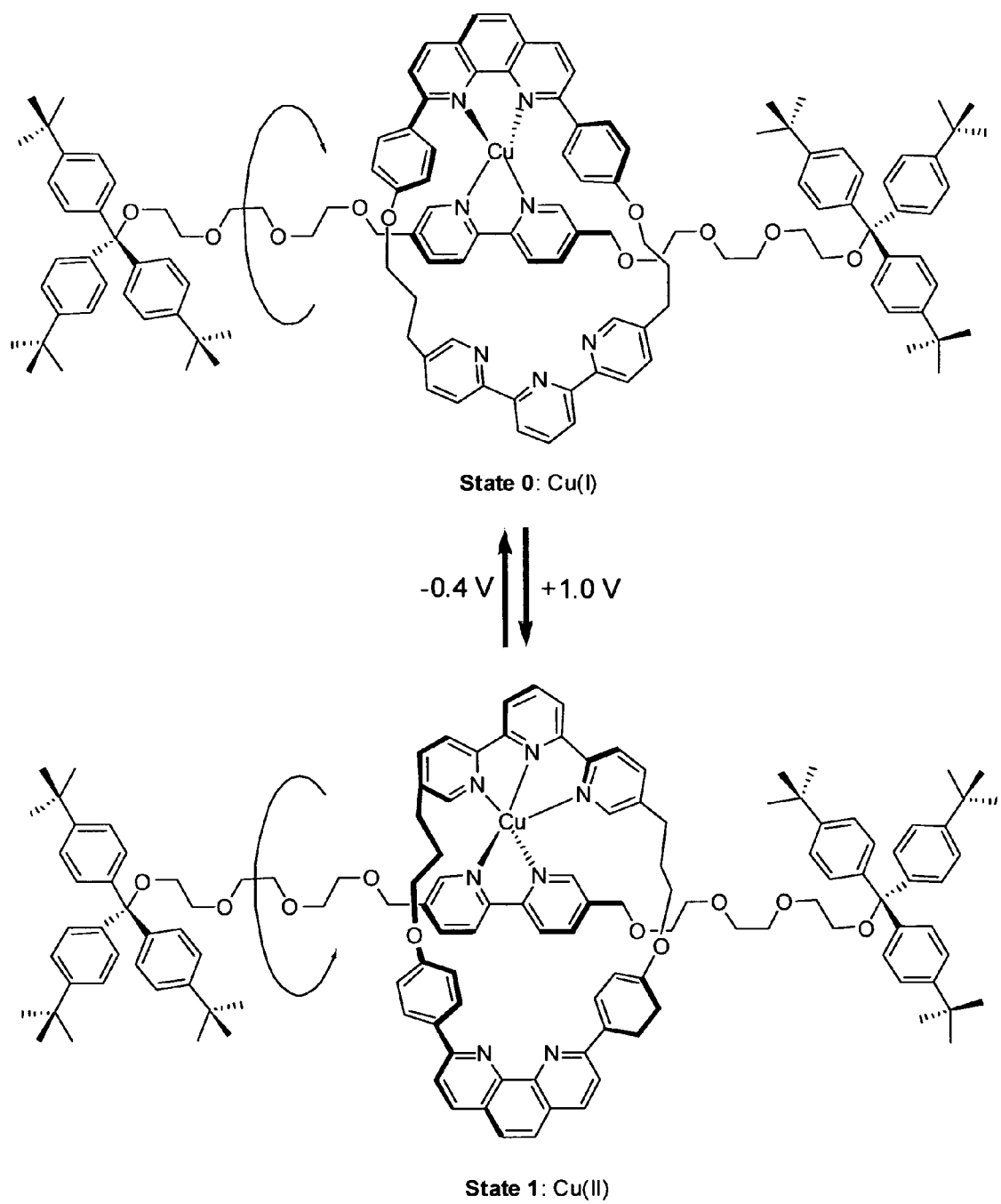
FIG. 16 shows a copper rotaxane operating as a Set/Reset (SR) flip-flop; modulation is achieved by electrochemical oxidation with a Set Input (+1.0 V) and Reset Input (−0.4 V). The changes in the coordination geometry of the Copper, tetra-coordinate for $Cu^I$ and penta-coordinate for $Cu^{II}$, are demonstrated, which are responsible for the rotation of the rotaxane around the central axis.

In view of the results above, even commercially available and cheap PEDOT could be utilized for the generation of multi-state memory in the form of flip-flop and flip-flap-flop logic circuits. In another aspect, an alternative system consists of a rotaxane with a central axis that incorporates 2,2'-bipyridine and a ring/wheel containing a bidentate 1,10-phenanthroline and a tridentate terpyridine unit (FIG. 16). Oxidation/reduction of the copper metal center in solution results in reversible spinning of the wheel around its central axes, since the $Cu^I$ prefers a four-coordinate environment (with 1,10-phenanthroline), whereas $Cu^{II}$ prefers a penta-coordinate environment (with terpyridine). These differences in the coordination environment are detectable by cyclic voltammetry and form the logic output of the reported system. If a Set input is chosen at +1.0 V, the copper is oxidized from $Cu^{1+} \rightarrow Cu^{2+}$ with a concurrent change in coordination geometry, and the system is in state 1. However, when Reset input is chosen at −0.4 V, the copper is reduced back, and a four-coordination geometry is favored, meaning, the system returns to state 0. When a neutral potential at +0.2 V is chosen, the effect on each state is minimal and the rotaxane maintains its current state, which completes the requirements of an Set/Reset flip-flop.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following invention and its various embodiments.

Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations. A teaching that two elements are combined in a claimed combination is further to be understood as also allowing for a claimed combination in which the two elements are not combined with each other, but may be used alone or combined in other combinations. The excision of any disclosed element of the invention is explicitly contemplated as within the scope of the invention.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a sub-combination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

REFERENCES

Aleshin A., Kiebooms R., Menon R., Heeger A. J., *Synth. Met.*, 1997, 90, 60.

Altman M., Shukla A., Zubkov T., Evmenenko G., Dutta Pulak., van der Boom M. E., Journal of the American Chemical Society, 2006, 128(22), 7374-7382.

Anderson G. K., Lin M., Inorganic Syntheses, 1990, 28, 60-63.

Motiei L., Altman M., Gupta T., Lupo F., Gulino A., Evmenenko G., Dutta P., van der Boom, M. E., Self-propagating assembly of a molecular-based multilayer. *J. Am. Chem. Soc.*, 2008, 130, 8913-8915.

Motiei L., Lahav M., Freeman D., M. E. van der Boom, Electrochromic Behavior of a Self-Propagating Molecular-Based Assembly, *J. Am. Chem. Soc.*, 2009, 131, 3468-3469.

Pariysami G., Levinde R. D., Remade F., *Aus. J Chem*, 2010, 63, 173.

The invention claimed is:

1. A solid-state, multi-valued, molecular random access memory (RAM) device, comprising:
   (i) an electrically, optically and/or magnetically addressable solid-state unit, comprising:
      a. a conductive substrate selected from the group consisting of glass, a doped glass, indium tin oxide (ITO)-coated glass, silicon, a doped silicon, Si(100), Si(111), $SiO_2$, SiH, silicon carbide mirror, quartz, a metal, metal oxide, a mixture of metal and metal oxide, group IV elements, mica, a graphite comprising intercalated metal cations, a polymer such as polyacrylamide and polystyrene, a plastic, a zeolite, a clay, a membrane, an optical fiber, a ceramic, a metalized ceramic, an alumina, an electrically-conductive material, a semiconductor, steel and a stainless steel;
      b. one or more layers of electrochromic, magnetic, redox-active, and/or photochromic materials deposited on said conductive substrate;
      c. a conductive top layer deposited on top of said one or more layers of (b);
   (ii) a memory writer that applies a plurality of predetermined values (1) of potential biases to said one or more layers of electrochromic, or redox-active materials; (2) of optical signals to said one or more layers of photochromic materials; or (3) of magnetic fields to said one or more layers of magnetic materials; to the unit, wherein each predetermined value applied results in a uniquely distinguishable (1) optical state of said one or more layers of electrochromic, redox-active or photochromic materials; (2) magnetic state of said one or more layers of magnetic materials; or (3) electrical state of said one or more layers of electrochromic or redox-active materials; of said unit, and thus corresponds to a unique logical value; and
   (iii) a memory reader for reading the optical, magnetic and/or electrical state of the unit,
   wherein said molecular RAM device is reconfigurable to work as a ternary, quaternary or any other multi-state memory, beyond ternary memory, device.

2. The molecular RAM device according to claim 1, wherein said conductive substrate is hydrophilic or hydrophobic.

3. The molecular RAM device according to claim 1, wherein said conductive substrate is transparent.

4. The molecular RAM device according to claim 1, wherein said conductive substrate is in the form of beads, microparticles, nanoparticles, quantum dots or nanotubes.

5. The molecular RAM device according to claim 1, wherein said conductive substrate is optically transparent to the ultraviolet (UV), infrared (IR), near-IR (NIR) and/or visible spectral ranges.

6. The molecular RAM device according to claim 1, wherein said one or more layers of electrochromic, magnetic, redox-active or photochromic materials comprise a plurality of identical or different layers of said electrochromic, magnetic, redox-active or photochromic materials.

7. The molecular RAM device according to claim 1, wherein said electrochromic materials comprise organic, metal-organic, inorganic or polymeric materials, or any combination thereof.

8. The molecular RAM device according to claim 7, wherein said organic or metal-organic material is selected from the group consisting of (i) viologen (4, 4'-bipyridylium salts) or its derivatives; (ii) azol compounds; (iii) aromatic amines; (iv) carbazoles; (v) cyanines; (vi) methoxybiphenyls; (vii) quinones; (viii) thiazines; (ix) pyrazolines; (x) tetracyanoquinodimethanes (TCNQs); (xi) tetrathiafulvalene (TTF); (xii) metal coordination complex wherein said complex is $[M^{II}(2,2'\text{-bipyridine})_3]^{2+}$ or $[M^{II}(2,2'\text{-bipyridine})_2(4\text{-methyl-}2,2'\text{-bipyridine-pyridine}]^{2'}$, wherein said M is iron, ruthenium, osmium, nickel, chromium, copper, rhodium, iridium or cobalt; or a polypyridyl metal complex selected from the group consisting of tris(4-[2-(4pyridy)ethenyl]-4'-methyl-2,2'-bipyridine Osmium(II) bis(hexafluorophosphate), tris(4-[2-(4pyridy)ethenyl]-4'-methyl-2,2'-bipyridine Cobalt (II) bis(hexafluorophosphate), tris(4-[2-(4pyridy)ethenyl]-4'-methyl-2,2'-bipyridine)Ruthenium(II)bis-(hexafluorophosphate), bis(2,2'-bipyridine)[4'-methyl-4-(2-(4pyridy)ethenyl)-2,2'-bipyridine] Osmium(II) [bis(hexafluorophosphate)/di-iodide] bis(2,2'-bipyridine)[4'-methyl-4-(2-(4-pyridy)ethenyl)-2,2'-bipyridine] Ruthenium (II) [bis(hexafluorophosphate)/di-iodide]bis(2,2'-bipyridine)[4'-methyl-4-(2-(4-(3-propyl trimethoxysilane) pyridinium) ethenyl)-2,2'-bipyridine] Osmium(II) [tris(hexafluorophosphate)/tri-iodide], and bis(2,2'-bipyridine)[4'-methyl-4-(2-(4-(3-propyl trimethoxysilane) pyridinium) ethenyl)-2,2'-bipyridine] Ruthenium(II) [tris(hexafluorophosphate)/tri-iodide] ; (xiii) metallophthalocyanines or porphyrins in mono, sandwich or polymeric forms; (xiv) metal hexacyanometallates; (xv) dithiolene complexes of nickel, palladium or platinum; (xvi) dioxylene complexes of osmium or ruthenium; (xvii) mixed-valence complexes of ruthenium, osmium or iron; and (xviii) derivatives thereof.

9. The molecular RAM device according to claim 8, wherein said viologen is methyl viologen (MV).

10. The molecular RAM device according to claim 8, wherein said azole compound is 4,4'-(1E,1'E)-4,4'-sulfonylbis(4,1-phenylene)bis(diazene-2,1-diyl)-bis(N,N-dimethylaniline).

11. The molecular RAM device according to claim 7, wherein said inorganic materials comprise tungsten oxide, iridium oxide, vanadium oxide, nickel oxide, molybdenum oxide, titanium oxide, manganese oxide, niobium oxide, copper oxide, tantalum oxide, rhenium oxide, rhodium oxide, ruthenium oxide, iron oxide, chromium oxide, cobalt oxide, cerium oxide, bismuth oxide, tin oxide, praseodymium, bismuth, lead, silver, lanthanide hydrides ($LaH_2/LaH_3$), nickel doped SrTiO3, indium nitride, ruthenium dithiolene, phostungstic acid, ferrocene-naphthalimides dyads, organic ruthenium complexes or any mixture thereof.

12. The molecular RAM device according to claim 7, wherein said polymeric materials comprise conducting polymers such as polypyrro les, polydioxypyrroles, polythiophenes, polyanilines, poly(acetylene)s, poly(p-phenylene sulfide), poly(p-phenylene vinylene)s (PPV), polyindoles, polypyrenes, polycarbazoles, polyazulenes, polyazepines, poly(fluorene)s, polynaphthalenes, polyfurans, metallopolymeric films based on polypyridyl complexes or polymeric viologen systems comprising pyrrole-substituted viologen pyrrole, disubstituted viologen, N,N'-bis(3-pyrrol -1-ylpropyl)-4,4'-bipyridilium or derivatives of said conducting polymers.

13. The molecular RAM device according to claim 7, wherein said photochromic materials comprise triarylmethanes, stilbenes, azastilbenes, nitrones, fulgides, spiropyrans, naphthopyrans, spiro-oxazines or quinones.

14. The molecular RAM device according to claim 1, wherein said conductive top layer comprises a thin metal film or a conductive polymer such as Nafion.

15. The molecular RAM device according to claim 1, wherein the memory reader reads the state of said unit optically, electrochemically, magnetically, electronically, reading changes in conductivity, refractive index readout, IR readout or NIR readout.

16. The molecular RAM device according to claim 1, wherein the memory reader is an optical device.

17. The molecular RAM device according to claim 1, wherein said device maintains its current state, between predefined threshold values, when no voltage is applied.

18. The molecular RAM device according to claim 1, wherein a plurality of units are coupled together and said memory reader can read the optical, magnetic and/or electronic state of said coupled units simultaneously.

19. The molecular RAM device according to claim 1, wherein said device comprises flip-flap-flop or any combination of logic circuits.

20. The molecular RAM device according to claim 1, wherein said conductive substrate is a metal-oxide or conductive polymer, said material comprises of polypyridyl complexes, and said conductive top layer is a metal-oxide or conductive polymer, such that said molecular RAM device is a flip-flop logic circuit set to state 1 by applying a voltage to oxidize said material and reset to state 0 by applying a voltage to reduce said material.

21. The molecular RAM device according to claim 1, wherein said conductive substrate is a metal-oxide or conductive polymer, said material comprises of polypyridyl complexes, and said conductive top layer is a metal-oxide or conductive polymer, such that said molecular RAM device is a flip-flap-flop logic circuit set to state-1 by applying a voltage to oxidize said material, set to state 1 by applying a voltage to partial oxidize or reduce said material and reset to state 0 by applying a voltage to reduce said material.

22. The molecular RAM device according to claim 1, wherein said conductive substrate is a metal-oxide or conductive polymer, said materials comprises of polypyridyl complexes, and said conductive top layer is a metal-oxide or conductive polymer, such that said molecular RAM device comprises 4-10 states logic circuits, said 4-10 states being obtained by applying predetermined voltages between -2 and 3 Volt.

23. The molecular RAM device according to claim 1, wherein said device does not maintain its current state when no voltage is applied.

24. The molecular RAM device according to claim 1, wherein said device comprises logic circuits.

25. A method for constructing a solid-state, multi-valued, molecular random access memory device, comprising:

constructing an electrically, optically and/or magnetically addressable solid-state unit by depositing one or more layers of electrochromic, magnetic, redox-active or photochromic materials deposited on a conductive substrate selected from the group consisting of glass, a doped glass, indium tin oxide (ITO)-coated glass, silicon, a doped silicon, Si(100), Si(111), $SiO_2$, SiH, silicon carbide mirror, quartz, a metal, metal oxide, a mixture of metal and metal oxide, group IV elements, mica, a graphite comprising intercalated metal cations, a polymer such as polyacrylamide and polystyrene, a plastic, a zeolite, a clay, a membrane, an optical fiber, a ceramic, a metalized ceramic, an alumina, an electrically-conductive material, a semiconductor, steel and a stainless steel, and then depositing a conductive top layer on top of said one or more layers, wherein a plurality of predetermined values (1) of potential biases are applied to said one or more layers of electrochromic, or redox-active materials; (2) of optical signals are applied to said one or more layers of photochromic materials; or (3) of magnetic fields are applied to said one or more layers of magnetic materials; such that each predetermined value applied results in a uniquely distinguishable (1) optical state of said one or more layers of electrochromic, redox-active or photochromic materials; (2) magnetic state of said one or more layers of magnetic materials; or (3) electrical state of said one or more layers of electrochromic or redox-active materials; and said molecular RAM device is reconfigurable to work as a ternary, quaternary or any other multi-state memory, beyond ternary memory, device.

\* \* \* \* \*